US012598831B2

(12) United States Patent
Lin et al.

(10) Patent No.: US 12,598,831 B2
(45) Date of Patent: Apr. 7, 2026

(54) PIXEL SHIELDING USING AIR GAPS

(71) Applicant: Taiwan Semiconductor Manufacturing Company, Ltd., Hsinchu (TW)

(72) Inventors: ChunHao Lin, Tainan City (TW); Yun-Wei Cheng, Taipei City (TW); Kuo-Cheng Lee, Tainan City (TW); Chien Nan Tu, Kaohsiung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 378 days.

(21) Appl. No.: 18/319,073

(22) Filed: May 17, 2023

(65) Prior Publication Data

US 2024/0387584 A1      Nov. 21, 2024

(51) Int. Cl.
*H01L 27/146* (2006.01)
*H10F 39/00* (2025.01)

(52) U.S. Cl.
CPC ......... *H10F 39/807* (2025.01); *H10F 39/011* (2025.01)

(58) Field of Classification Search
CPC ..... H10F 39/807; H10F 39/011; H10F 39/811
USPC ......................................................... 257/446
See application file for complete search history.

(56) References Cited

U.S. PATENT DOCUMENTS

| | | | |
|---|---|---|---|
| 11,302,734 B2 | 4/2022 | Wu et al. | |
| 2017/0133414 A1* | 5/2017 | Chiang ................. | H10F 39/199 |
| 2018/0151615 A1* | 5/2018 | Wen ..................... | H10F 39/199 |
| 2020/0006410 A1* | 1/2020 | Wu ....................... | H10F 39/199 |
| 2022/0115421 A1 | 4/2022 | Huang et al. | |
| 2022/0231065 A1 | 7/2022 | Chou et al. | |
| 2022/0310675 A1 | 9/2022 | Kim et al. | |
| 2022/0311944 A1 | 9/2022 | Kim et al. | |

FOREIGN PATENT DOCUMENTS

| | | |
|---|---|---|
| CN | 115832104 A | 3/2023 |
| TW | I696279 B | 6/2020 |
| TW | 202238979 A | 10/2022 |

* cited by examiner

*Primary Examiner* — Tong-Ho Kim
(74) *Attorney, Agent, or Firm* — Harrity & Harrity, LLP

(57) ABSTRACT

A shielding structure of air gaps, formed on a grid structure between pixel sensors in a pixel array, reduces crosstalk. Efficiency and signal-to-noise ratio of the pixel sensors is increased because crosstalk is reduced. The shielding structure also increases quantum efficiency of the pixel array because the air gaps do not adsorb photons.

20 Claims, 26 Drawing Sheets

300

200

202

314
312
306
304
308
404
310
402

400

900

910 Form a metal layer over an isolation structure that at least partially surrounds a photodiode 920 Etch a portion of the metal layer to form at least one recess 930 Form at least one dielectric layer, over the metal layer, to enclose an air gap in the metal layer

PIXEL SHIELDING USING AIR GAPS

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates read-out of the measurements. One type of image sensor commonly used in optical imaging devices is a back side illumination (BSI) image sensor. BSI image sensor fabrication can be integrated into semiconductor processes for low cost, small size, and high integration. Further, BSI image sensors have low operating voltage, low power consumption, high quantum efficiency, and low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
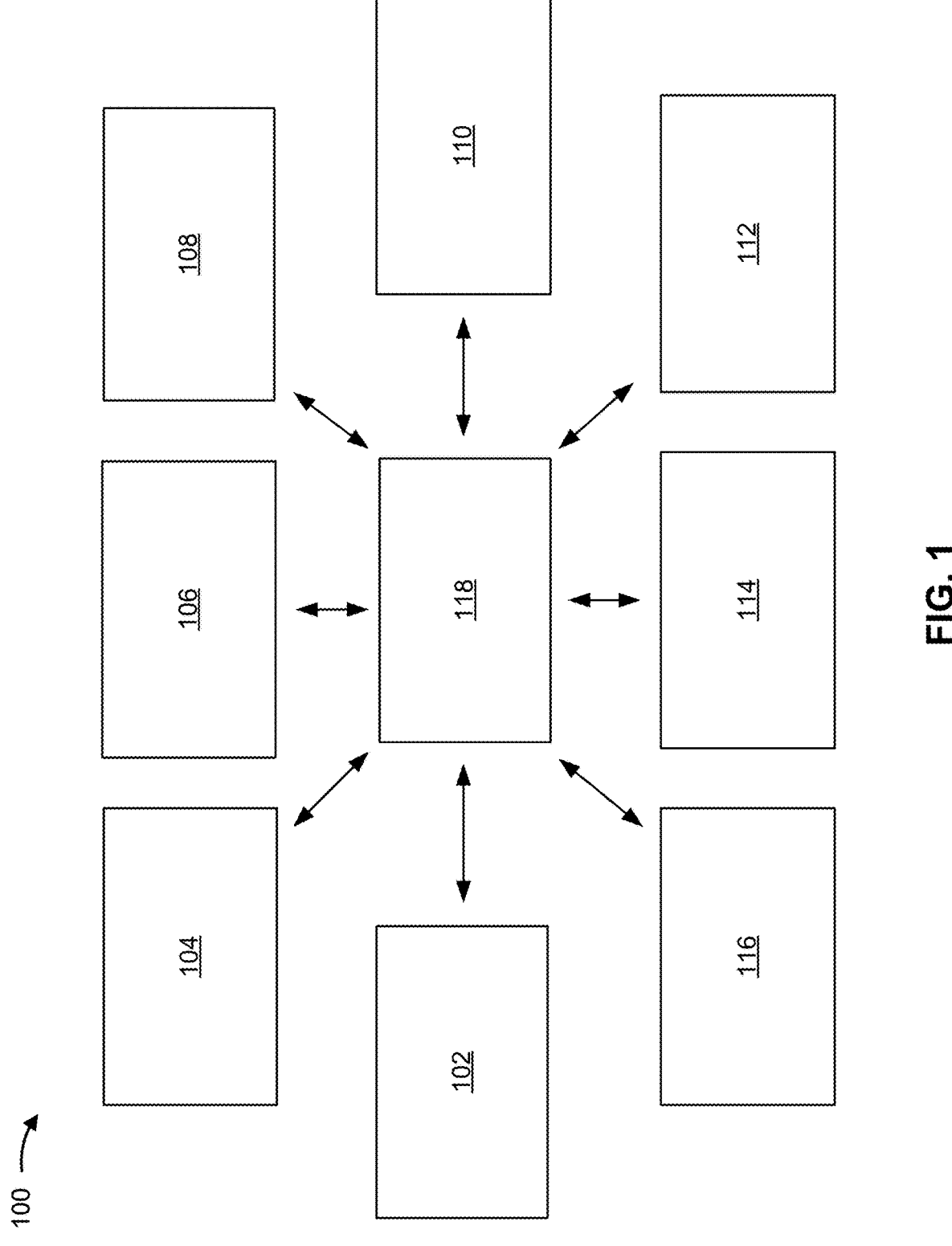
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Optical crosstalk can occur between adjacent pixel regions in a pixel array (e.g., a back side illumination (BSI) complementary metal oxide semiconductor (CMOS) image sensor and/or another type of CMOS image sensor). Optical crosstalk is a phenomena whereby incident light passes through a pixel region at a non-orthogonal angle and is at least partially absorbed by a photodiode of an adjacent pixel region. Optical crosstalk in a pixel array of a CMOS image sensor can degrade the spatial resolution of the CMOS image sensor, can reduce overall sensitivity of the CMOS image sensor, can cause color mixing between pixel regions of the CMOS image sensor, and/or can lead to image noise after color correction.

In some cases, a shielding structure may be formed on a grid structure between pixel sensors in the pixel array. The shielding structure helps reduce crosstalk between the pixel sensors. The shielding structure may be formed of metal, but metal absorbs photons and thus reduces quantum efficiency (QE) of the pixel array. Accordingly, a hybrid shielding structure formed of metal and oxide may be used instead. The hybrid shielding structure improves both QE of the pixel array and signal-to-noise (SNR) ratio. However, the hybrid shielding structure still exhibits QE loss because of the metal in the hybrid grid. Additionally, the oxide of the hybrid shielding structure increases crosstalk as compared with the metal shielding structure.

Some implementations described herein provide techniques and apparatuses for forming a shielding structure of air gaps on a grid structure between pixel sensors in a pixel array. Because air provides close to total reflection, the air gaps reduce crosstalk while also increasing QE of the pixel array because the air gaps do not adsorb photons. Additionally, efficiency and SNR of the pixel sensors are increased because crosstalk is reduced.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, a photoresist removal tool 114, an annealing tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, an epitaxy tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The photoresist removal tool 114 is a semiconductor processing tool that is capable of removing remaining portions of a photoresist layer from a substrate after the etch tool 108 removes portions of the substrate. For example, the photoresist removal tool 114 may use a chemical stripper and/or another technique to remove a photoresist layer from a substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form a metal layer over an isolation structure that at least partially surrounds a photodiode, etch a portion of the metal layer to form at least one recess, and/or form at least one dielectric layer over the metal layer such that the at least one dielectric layer encloses an air gap in the metal layer, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. For example, the deposition tool 102 may include the plating tool 112. Additionally, or alternatively, a set of devices (e.g., one or more devices) of the example environment 100 may perform one or more functions described as being performed by another set of devices of the example environment 100.

Figure 2:
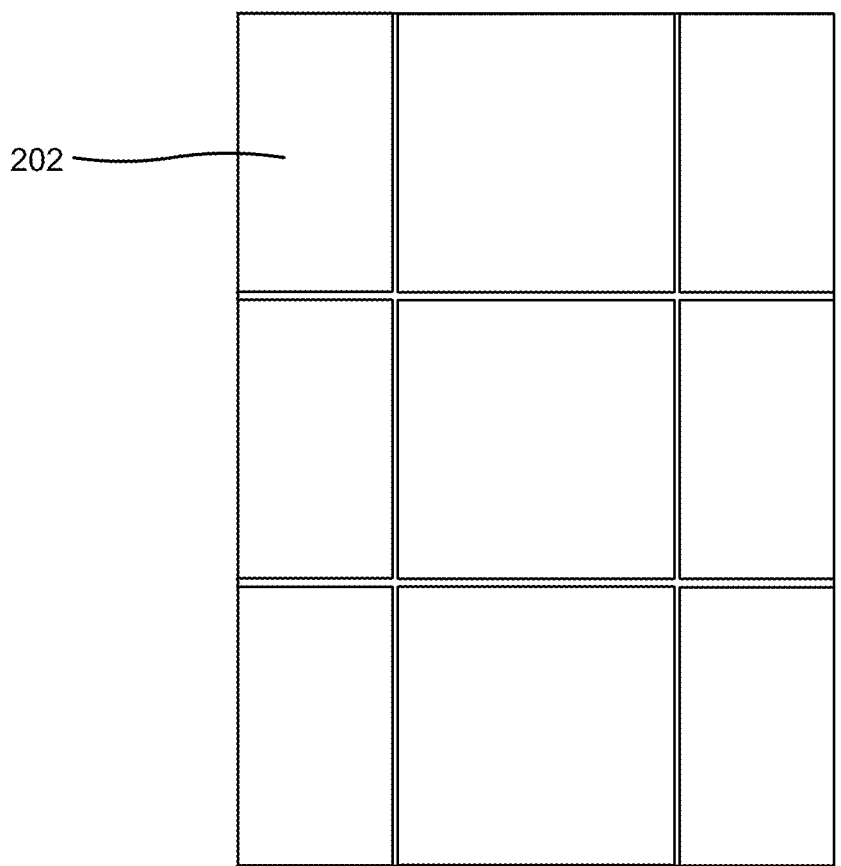
FIG. 2 is a diagram of an example pixel array described herein.

FIG. 2 is a diagram of an example pixel array 200 (or a portion thereof) described herein. The pixel array 200 may be included in an image sensor, such as a CMOS image sensor, a BSI CMOS image sensor, or another type of image sensor.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3A:
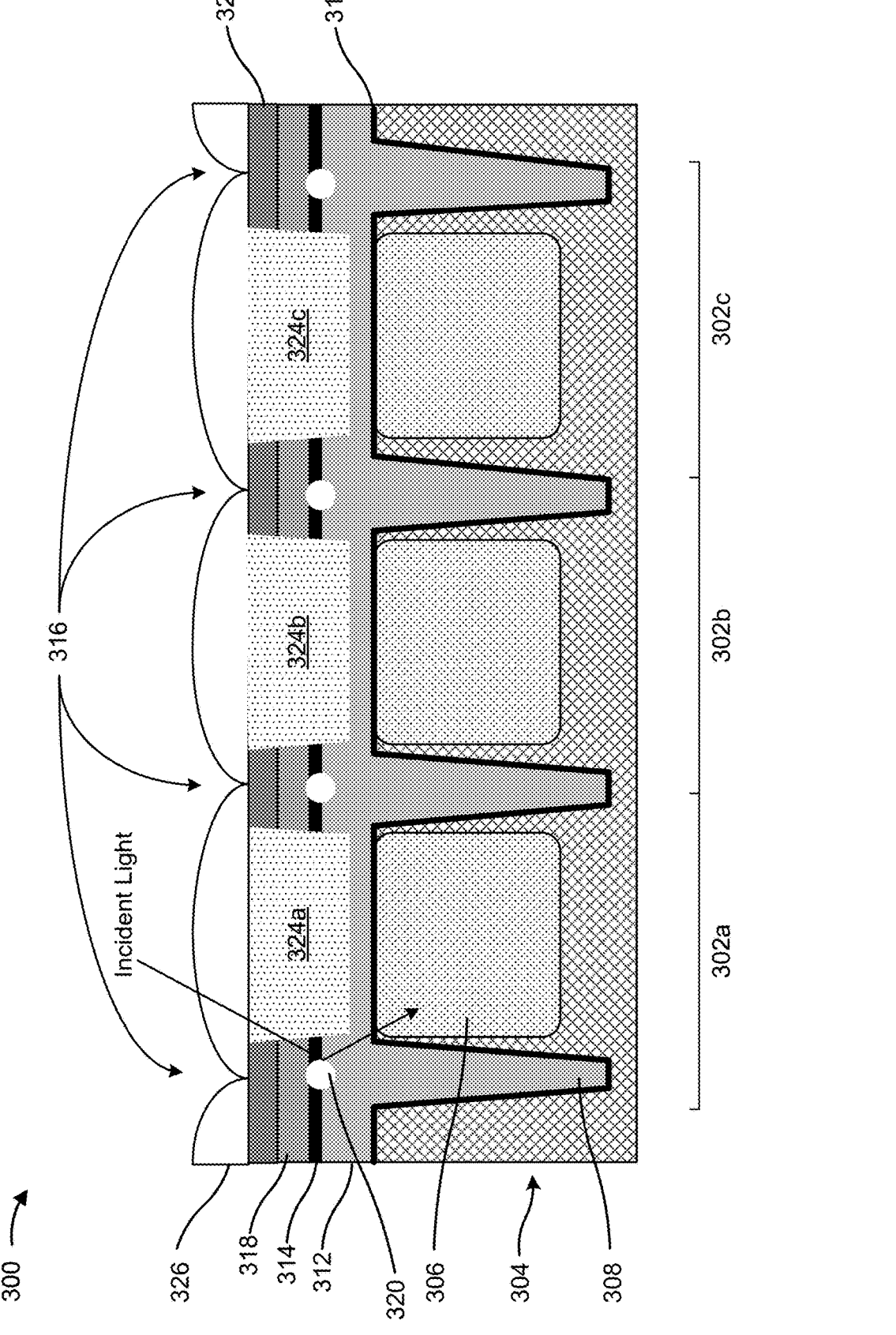
FIGS. 3A-3D are diagrams of example semiconductor structures described herein.

FIG. 3A is a diagram of an example pixel array 300 described herein. In some implementations, the example pixel array 300 illustrated in FIG. 3A may include, or may be included in, the pixel array 200 (or a portion thereof). In some implementations, the pixel array 300 may be included in an image sensor. The image sensor may be a CMOS image sensor, a BSI CMOS image sensor, or another type of image sensor.

As shown in FIG. 3A, the pixel array 300 may include a plurality of adjacent pixel sensors 302, such as pixel sensors 302a, 302b, and 302c. In some implementations, the pixel sensors 302a, 302b, and 302c are configured as square-shaped pixel sensors 202 included in the pixel array 200. In some implementations, the pixel sensors 302a, 302b, and 302c are configured as octagon-shaped pixel sensors and/or square-shaped pixel sensors. In some implementations, the pixel sensors 302a, 302b, and 302c include additional or alternative shapes of pixel sensors or a combination thereof.

The pixel sensors 302 may be formed in a substrate 304, which may include a semiconductor die substrate, a semiconductor wafer, or another type of substrate in which semiconductor pixels may be formed. In some implementations, the substrate 304 is formed of silicon (Si), a material including silicon, a III-V compound semiconductor material such as gallium arsenide (GaAs), a silicon on insulator (SOI), or another type of semiconductor material that is capable of generating a charge from photons of incident light.

Each pixel sensor 302 may include a photodiode 306. A photodiode 306 may include a region of the substrate 304 that is doped with a plurality of types of ions to form a p-n junction or a PIN junction (e.g., a junction between a p-type portion, an intrinsic (or undoped) type portion, and an n-type portion). For example, the substrate 304 may be doped with an n-type dopant to form a first portion (e.g., an n-type portion) of a photodiode 306 and a p-type dopant to form a second portion (e.g., a p-type portion) of the photodiode 306. A photodiode 306 may be configured to absorb photons of incident light. The absorption of photons causes a photodiode 306 to accumulate a charge (referred to as a photocurrent) due to the photoelectric effect. Here, photons bombard the photodiode 306, which causes emission of electrons of the photodiode 306. The emission of electrons causes the formation of electron-hole pairs, where the electrons migrate toward the cathode of the photodiode 306 and the holes migrate toward the anode, which produces the photocurrent.

An isolation structure 308 may be included in the substrate 304 between adjacent pixel sensors 302. The isolation structure 308 may provide optical isolation by blocking or preventing diffusion or bleeding of light from one pixel sensor 302 to another pixel sensor 302, thereby reducing crosstalk between adjacent pixel sensors 302. The isolation structure 308 may include trenches or deep trench isolation (DTI) structures that are coated or lined with an antireflective coating (ARC) 310 and filled with a dielectric layer (e.g., over the ARC 310). The isolation structure 308 may be formed in a grid layout in which the isolation structure 308 extends around the perimeters of the pixel sensors 302 in the pixel array 300 and intersects at various locations of the pixel array 300. In some implementations, the isolation structure 308 is formed in the backside of the substrate 304 to provide optical isolation between the pixel sensors 302, and thus may be referred to as a backside DTI (BDTI) structure.

The ARC 310 may be included within the isolation structures 308 and on the substrate 304 above the photodiodes 306. The ARC 310 may include a suitable material for reducing a reflection of incident light projected toward the photodiodes 306. For example, the ARC 310 may include nitrogen-containing material.

A dielectric layer 312 may function as a dielectric buffer layer between the photodiodes 306 and the layers above the photodiodes 306. The dielectric layer 312 may include an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another dielectric material that is capable of providing optical isolation between the pixel sensors 302.

A metal layer 314 may be included above and/or on the dielectric layer 312. The metal layer 314 may include a metallic material such as tungsten (W), copper (Cu), aluminum (Al), cobalt (Co), nickel (Ni), titanium (Ti), tantalum (Ta), another conductive material, and/or an alloy including one or more of the foregoing. The metal layer 314 may be etched such that a grid structure 316 is formed between the pixel sensors 302 and over the isolation structure 308. The grid structure 316 may include a plurality of interconnected columns of the metal layer 314. The grid structure 316 may surround the perimeters of the pixel sensors 302, and may be configured to provide additional crosstalk reduction and/or mitigation in combination with the isolation structure 308.

To further reduce crosstalk between adjacent pixel sensors 302, a dielectric layer 318 may be included in the grid structure 316. The dielectric layer 318 may include an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another dielectric material that is capable of providing optical isolation between the pixel sensors 302. The metal layer 314 and the dielectric layer 318 may form a hybrid shielding structure of the grid structure 316.

The hybrid shielding structure may include air gaps 320 enclosed within the metal layer 314 (and optionally within the dielectric layer 312 supporting the metal layer 314). For example, recesses may be etched into the metal layer 314 such that the air gaps 320 are enclosed when the dielectric layer 318 is formed over the metal layer 314. Because the index of refraction of air is very low (approximately less than 1.0001, which is very close to the index of refraction of vacuum, defined as 1), incident light is very likely to experience total reflection off the air gaps 320, as shown in FIG. 3A. As a result, the air gaps 320 reduce photon loss and therefore increase QE and SNR of the pixel sensors 302. Additionally, the air gaps 320 further decrease crosstalk between adjacent pixel sensors 302.

In some implementations, oxide material may be formed on a surface of the air gaps 320. For example, as described in connection with FIG. 4F, the air gaps 320 may close when the dielectric layer 318 is formed over the metal layer 314. However, during formation of the dielectric layer 318, some oxide material may form on one or more surfaces of the air gaps 320, such as an exposed surface of the metal layer 314 and/or an exposed surface of the dielectric layer 312. Additionally, or alternatively, a precursor material and/or a carrier gas used in formation of the dielectric layer 318 may remain trapped in the air gaps 320. Because the air gaps 320 remain enclosed after formation of the dielectric layer 318, the oxide material may remain (at least in trace amounts) on the surface(s) of the air gaps 320. As used herein, "trace amounts" refer to amounts present on less than 50% of a surface area.

A passivation layer 322 may be included over the grid structure 316, over the hybrid shielding structure, and over the portions of the dielectric layer 312 that are not covered by the hybrid shielding structure. The passivation layer 322 may include an oxide material to provide protection for the layers beneath the passivation layer 322 from the layers and structures that are formed above the passivation layer 322.

Respective color filter regions 324 may be included in the areas between the grid structure 316 and on the passivation layer 322. For example, a color filter region 324a may be formed in between the grid structure 316 over the photodiode 306 of the pixel sensor 302a, a color filter region 324b may be formed in between the grid structure 316 over the photodiode 306 of the pixel sensor 302b, a color filter region 324c may be formed in between the grid structure 316 over the photodiode 306 of the pixel sensor 302c, and so on. Alternatively, the areas between the grid structure 316 may be completely filled with the passivation layer 322, and a color filter layer including the color filter regions 324 may be formed above the grid structure 316 on the passivation layer 322.

Each color filter region 324 may be configured to filter incident light to allow a particular wavelength of the incident light to pass to a photodiode 306 of an associated pixel sensor 302. For example, the color filter region 324a included in the pixel sensor 302a may filter red light for the pixel sensor 302a (and thus, the pixel sensor 302a may be a red pixel sensor), the color filter region 324b included in the pixel sensor 302b may filter green light for the pixel sensor 302b (and thus, the pixel sensor 302b may be a green pixel sensor), the color filter region 324c included in the pixel sensor 302c may filter blue light for the pixel sensor 302c (and thus, the pixel sensor 302c may be a blue pixel sensor), and so on.

A blue filter region may permit the component of incident light near a 450 nanometer (nm) wavelength to pass through a color filter region 324 and block other wavelengths from passing. A green filter region may permit the component of incident light near a 550 nm wavelength to pass through a color filter region 324 and block other wavelengths from passing. A red filter region may permit the component of incident light near a 650 nm wavelength to pass through a color filter region 324 and block other wavelengths from passing. A yellow filter region may permit the component of incident light near a 580 nm wavelength to pass through a color filter region 324 and block other wavelengths from passing.

In some implementations, the color filter region 324 may be non-discriminating or non-filtering, which may define a white pixel sensor. A non-discriminating or non-filtering color filter region 324 may include a material that permits all wavelengths of light to pass into the associated photodiode 306 (e.g., for purposes of determining overall brightness to increase light sensitivity for the image sensor). In some implementations, a color filter region 324 may be a near infrared (NIR) bandpass color filter region, which may define an NIR pixel sensor. An NIR bandpass color filter region 324 may include a material that permits the portion of incident light in an NIR wavelength range to pass to an associated photodiode 306 while blocking visible light from passing.

A micro-lens layer 326 may be included above and/or on the color filter regions 324. The micro-lens layer 326 may include a respective micro-lens for each of the pixel sensors 302. For example, a micro-lens may be formed to focus incident light toward the photodiode 306 of the pixel sensor 302a, another micro-lens may be formed to focus incident light toward the photodiode 306 of the pixel sensor 302b, another micro-lens may be formed to focus incident light toward the photodiode 306 of the pixel sensor 302c, and so on.

Figure 3B:
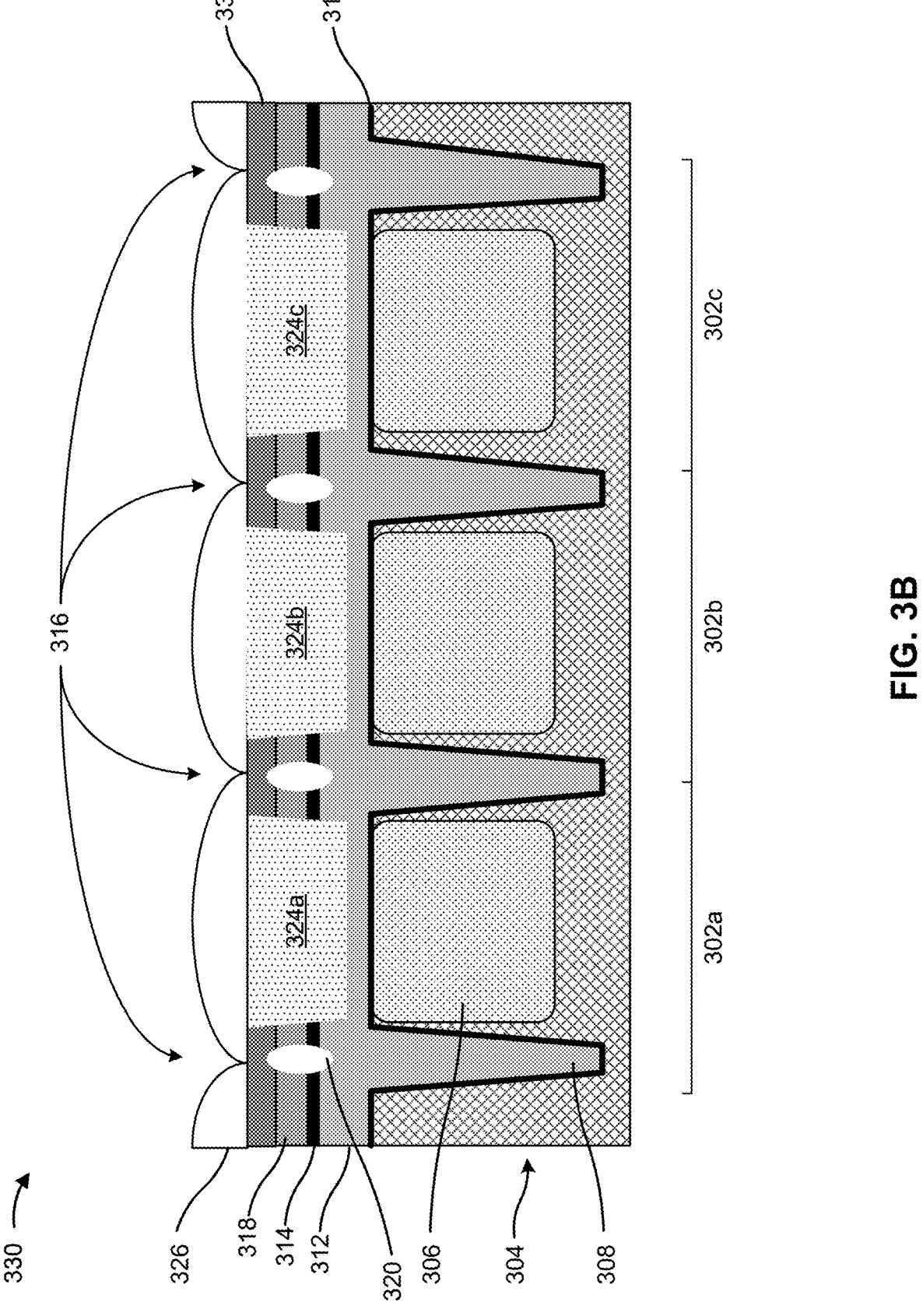

FIG. 3B is a diagram of an example pixel array 330 described herein. In some implementations, the example pixel array 330 illustrated in FIG. 3B may include, or may be included in, the pixel array 200 (or a portion thereof). In some implementations, the pixel array 330 may be included in an image sensor. The image sensor may be a CMOS image sensor, a BSI CMOS image sensor, or another type of image sensor.

The example pixel array 330 of FIG. 3B is similar to the example pixel array 300 of FIG. 3A. The air gaps 320 in the example pixel array 330 extend into the dielectric layer 318. For example, the air gaps 320 may be reopened via etching after the dielectric layer 318 is deposited, such that the air gaps 320 are enclosed when a dielectric layer 332 is formed over the dielectric layer 318. The dielectric layer 332 may include an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another dielectric material that is capable of providing optical isolation between the pixel sensors 302. Accordingly, the metal layer 314, the dielectric layer 318, and the dielectric layer 332 may form a hybrid shielding structure of the grid structure 316.

Because the index of refraction of air is very low (approximately less than 1.0001, which is very close to the index of refraction of vacuum, defined as 1), incident light is very likely to experience total reflection off the air gaps 320. Because the air gaps 320 extend into the dielectric layer 318, more photons experience total reflection, which further reduces photon loss and therefore increases QE and SNR of the pixel sensors 302.

In some implementations, oxide material may be formed on a surface of the air gaps 320. For example, as described in connection with FIG. 5C, the air gaps 320 may close when the dielectric layer 332 is formed over the dielectric layer 318. However, during formation of the dielectric layer 332, some oxide material may form on one or more surfaces of the air gaps 320, such as an exposed surface of the dielectric layer 318, an exposed surface of the metal layer 314, and/or an exposed surface of the dielectric layer 312. Additionally, or alternatively, a precursor material and/or a carrier gas used in formation of the dielectric layer 332 may remain trapped in the air gaps 320. Because the air gaps 320 remain enclosed after formation of the dielectric layer 332, the oxide material may remain (at least in trace amounts) on the surface(s) of the air gaps 320.

Figure 3C:
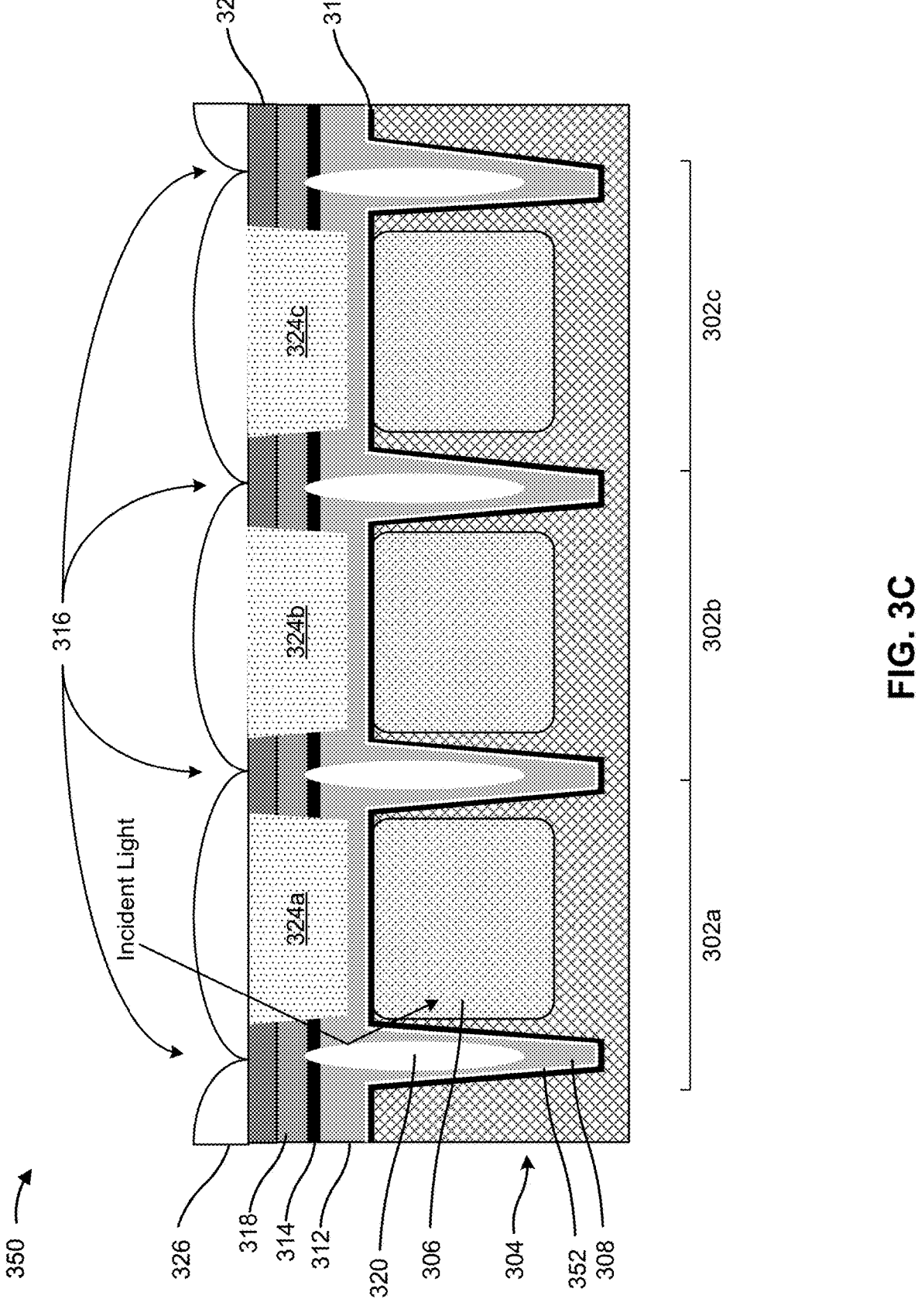

FIG. 3C is a diagram of an example pixel array 350 described herein. In some implementations, the example pixel array 350 illustrated in FIG. 3C may include, or may be included in, the pixel array 200 (or a portion thereof). In some implementations, the pixel array 350 may be included in an image sensor. The image sensor may be a CMOS image sensor, a BSI CMOS image sensor, or another type of image sensor.

The example pixel array 350 of FIG. 3C is similar to the example pixel array 300 of FIG. 3A. The air gaps 320 in the example pixel array 350 extend into the isolation structures 308. For example, an etch stop layer (ESL) 352 allows recesses to be etched beyond the metal layer 314 and into the isolation structures 308 without extending beyond the isolation structures 308. An ESL includes a material that is resistant (or at least partially resistant) to particular types of dry etching and/or wet etching. An ESL may include a material that is resistant to etchants that may otherwise be used to etch other layers near the ESL. Selecting such a material provides etch selectivity and enables the ESL to remain unetched (or mostly unetched) while other layers are etched. For example, the ESL 352 may include a nitride (such as aluminum nitride (AlN) and/or silicon nitride (SiN)) and/or an oxide (such as a silicon oxynitride ($SiO_xN_y$), aluminum oxynitride (AlON), and/or a silicon oxide ($SiO_x$)). In some implementations, the ESL 352 includes a plurality of ESLs stacked together and configured to function as a single ESL.

Because the index of refraction of air is very low (approximately less than 1.0001, which is very close to the index of refraction of vacuum, defined as 1), incident light is very likely to experience total reflection off the air gaps 320. Because the air gaps 320 extend into the isolation structures 308, more photons experiences total reflection, which further reduces photon loss and therefore increases QE and SNR of the pixel sensors 302.

In some implementations, oxide material may be formed on a surface of the air gaps 320. For example, as described in connection with FIG. 6F, the air gaps 320 may close when the dielectric layer 318 is formed over the metal layer 314. However, during formation of the dielectric layer 318, some oxide material may form on one or more surfaces of the air gaps 320, such as an exposed surface of the metal layer 314, an exposed surface of the dielectric layer 312, and/or an exposed surface of the isolation structures 308. Additionally, or alternatively, a precursor material and/or a carrier gas used in formation of the dielectric layer 318 may remain trapped in the air gaps 320. Because the air gaps 320 remain enclosed after formation of the dielectric layer 318, the oxide material may remain (at least in trace amounts) on the surface(s) of the air gaps 320.

Figure 3D:
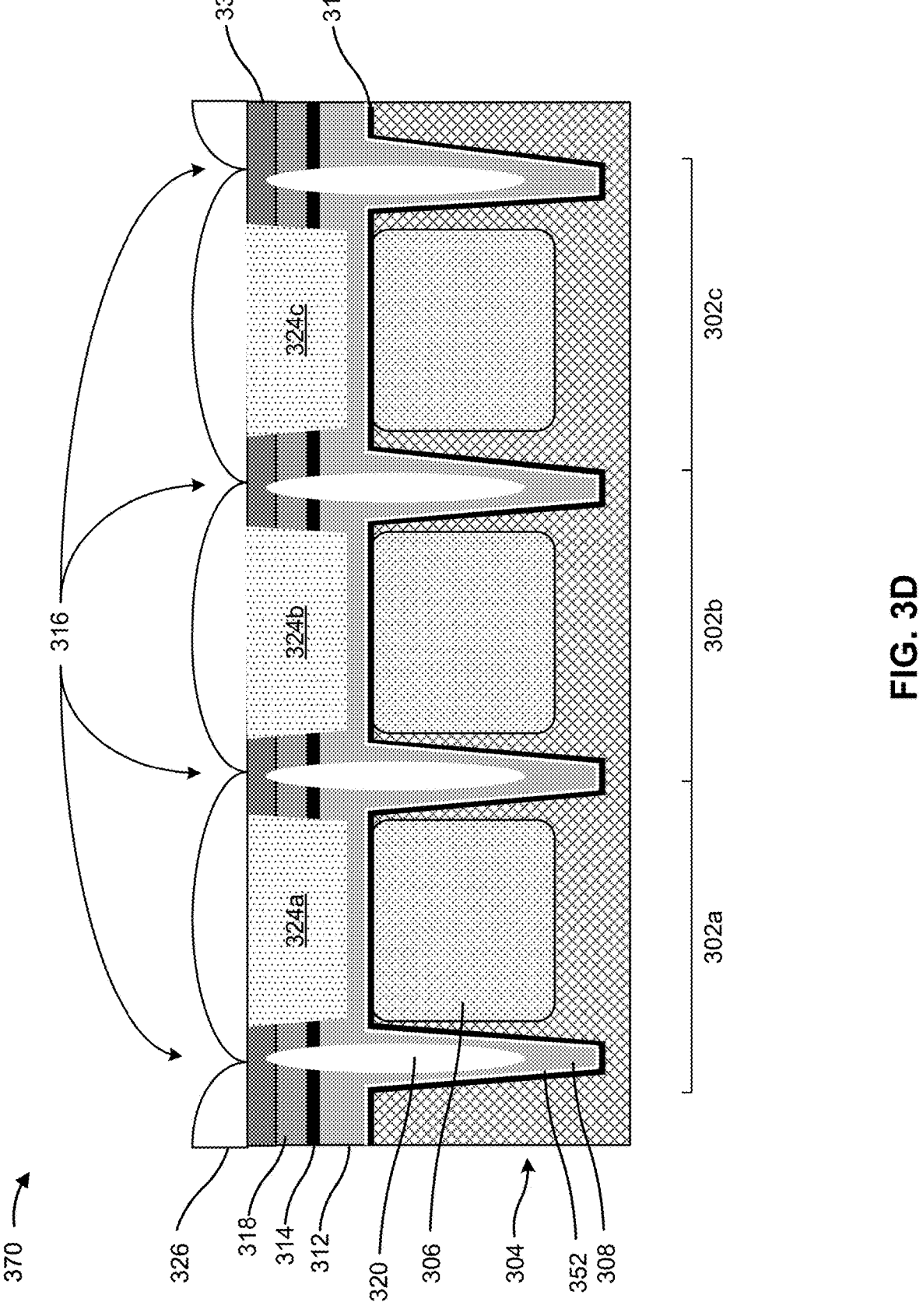

FIG. 3D is a diagram of an example pixel array 370 described herein. In some implementations, the example pixel array 370 illustrated in FIG. 3D may include, or may be included in, the pixel array 200 (or a portion thereof). In some implementations, the pixel array 370 may be included in an image sensor. The image sensor may be a CMOS image sensor, a BSI CMOS image sensor, or another type of image sensor.

The example pixel array 370 of FIG. 3D is similar to the example pixel array 300 of FIG. 3A. The air gaps 320 in the example pixel array 370 extend into the isolation structures 308. For example, an ESL 352 allows recesses to be etched beyond the metal layer 314 and into the isolation structures 308 without extending beyond the isolation structures 308.

Additionally, air gaps 320 in the example pixel array 370 extend into the dielectric layer 318. For example, the air gaps 320 may be reopened via etching after the dielectric layer 318 is deposited, such that the air gaps 320 are enclosed when a dielectric layer 332 is formed over the dielectric layer 318. Accordingly, the metal layer 314, the dielectric layer 318, and the dielectric layer 332 may form a hybrid shielding structure of the grid structure 316.

Because the index of refraction of air is very low (approximately less than 1.0001, which is very close to the index of refraction of vacuum, defined as 1), incident light is very likely to experience total reflection off the air gaps 320. Because the air gaps 320 extend into the isolation structures 308 and into the dielectric layer 332, more photons experience total reflection, which further reduces photon loss and therefore increases QE and SNR of the pixel sensors 302.

In some implementations, oxide material may be formed on a surface of the air gaps 320. For example, as described in connection with FIG. 7C, the air gaps 320 may close when the dielectric layer 332 is formed over the dielectric layer 318. However, during formation of the dielectric layer 332, some oxide material may form on one or more surfaces of the air gaps 320, such as an exposed surface of the dielectric layer 318, an exposed surface of the metal layer 314, exposed surface of the dielectric layer 312, and/or an exposed surface of the isolation structures 308. Additionally, or alternatively, a precursor material and/or a carrier gas used in formation of the dielectric layer 332 may remain trapped in the air gaps 320. Because the air gaps 320 remain enclosed after formation of the dielectric layer 332, the oxide material may remain (at least in trace amounts) on the surface(s) of the air gaps 320.

As indicated above, FIGS. 3A-3D are provided as examples. Other examples may differ from what is described with regard to FIGS. 3A-3D.

FIGS. 4A-4F are diagrams of an example implementation 400 described herein. Example implementation 400 may be an example process for forming the example pixel array 300 having air gaps in a metal layer of a hybrid shielding structure. The example pixel array formed using example implementation 400 may be included in a CMOS image sensor, a BSI CMOS image sensor, or another type of image sensor.

Figure 4A:
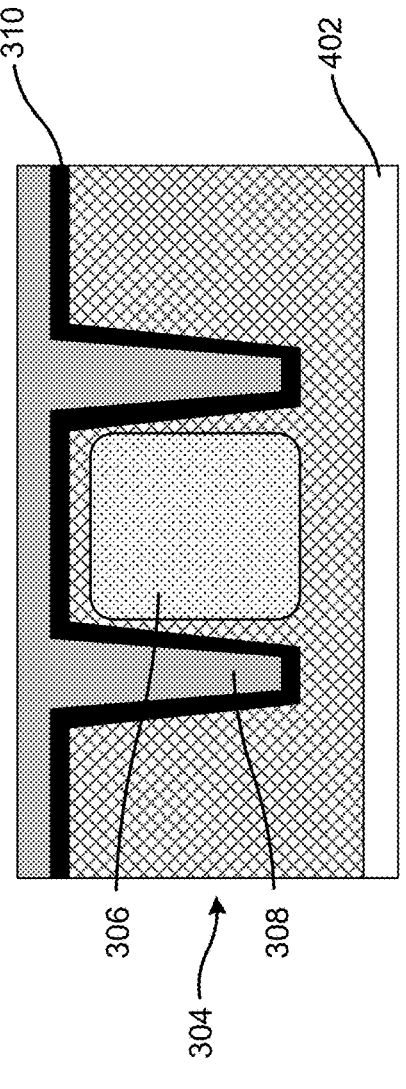
FIGS. 4A-4F are diagrams of an example implementation described herein.
Figure 4A:

As shown in FIG. 4A, the example process for forming the pixel array may be performed in connection with a substrate 304. As described above, the substrate 304 may include a semiconductor die substrate, a semiconductor wafer, a stacked semiconductor wafer, or another type of substrate in which semiconductor pixels may be formed. For example, the substrate 304 may be formed of silicon (Si) (e.g., a silicon substrate), a material including silicon, a III-V compound semiconductor material such as gallium arsenide (GaAs), an SOI, or another type of semiconductor material that is capable of generating a charge from photons of incident light. In some implementations, the substrate 304 is formed of a doped material (e.g., a p-doped material or an n-doped material) such as a doped silicon.

Additionally, the substrate 304 may have a photodiode 306 formed therein. As further shown in FIG. 4A, an isolation structure 308 (e.g., a DTI structure) may be included in the substrate 304 at least partially surrounding the photodiode 306. The isolation structure 308 may be coated or lined with an ARC 310 and filled with a dielectric layer (e.g., over the ARC 310). Additionally, or alternatively, the ARC 310 may include a high-$\kappa$ material. Examples of high-$\kappa$ dielectric materials that may be used in the ARC 310 may include high-$\kappa$ metal oxides such as a hafnium oxide (HfO$_x$), an aluminum oxide (Al$_x$O$_y$), a zirconium oxide (ZrO$_x$), a magnesium oxide (MgO$_x$), a yttrium oxide (Y$_x$O$_y$), a tantalum oxide (Ta$_x$O$_y$), a titanium oxide (TiO$_x$), a lanthanum oxide (La$_x$O$_y$), a barium oxide (BaO$_x$), or another type of high-$\kappa$ metal oxide. The substrate 304 may be supported by an ESL 402 to prevent overetching of the substrate 304 during formation of the isolation structure 308.

Figure 4B:
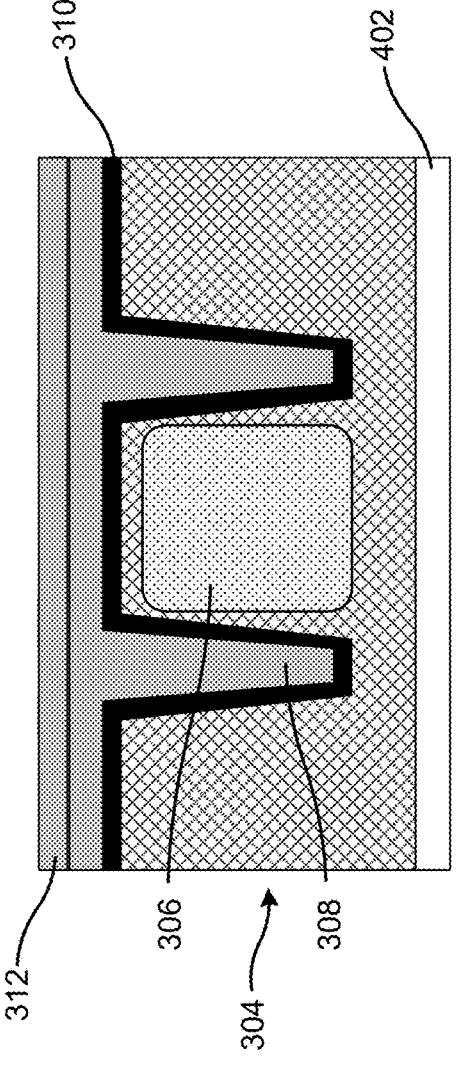

As shown in FIG. 4B, a dielectric layer 312 may be formed over the isolation structure 308. For example, the deposition tool 102 may form the dielectric layer 312 over and/or on the frontside surface of the substrate 304 (e.g., over the dielectric layer filling the isolation structure 308). In some implementations, the deposition tool 102 may form the dielectric layer 312 using a spin-coating technique, a CVD technique, a PVD technique, an ALD technique, and/or another deposition technique.

Figure 4C:
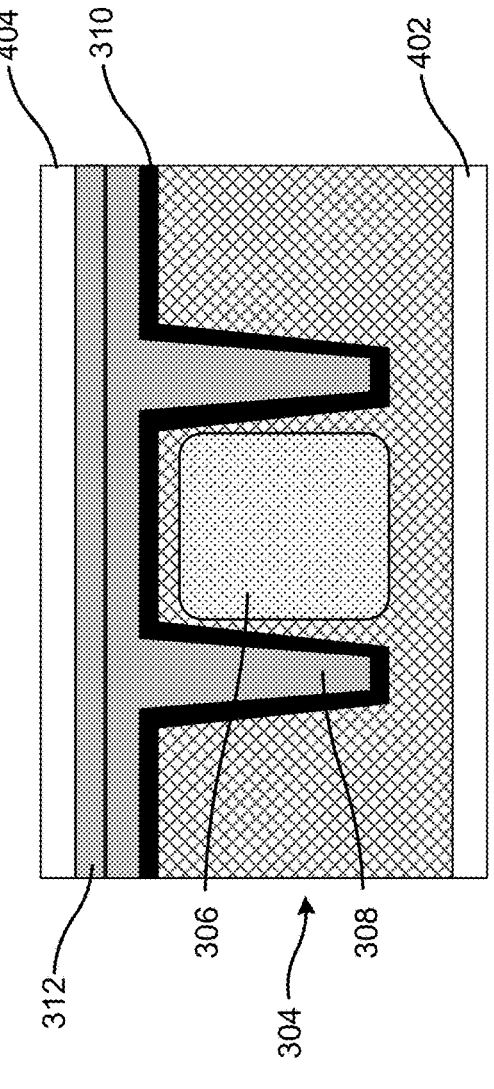

As shown in FIG. 4C, a buffer layer 404 may be formed over the dielectric layer 312. For example, the deposition tool 102 may form the buffer layer 404 over and/or on the frontside surface of the substrate 304 (e.g., over the dielectric layer 312). In some implementations, the deposition tool 102 may form the buffer layer 404 using a spin-coating technique, a CVD technique, a PVD technique, an ALD technique, and/or another deposition technique.

The buffer layer 404 may include a dielectric material to provide protection for the layers beneath the buffer layer 404 from the layers and structures that are formed above the buffer layer 404. Additionally, or alternatively, the buffer layer 404 may chemically interact with precursor materials used to deposit metal layer 314 (e.g., as described in connection with FIG. 4D). The buffer layer 404 may thus provide a surface for formation of the metal layer 314.

Figure 4D:
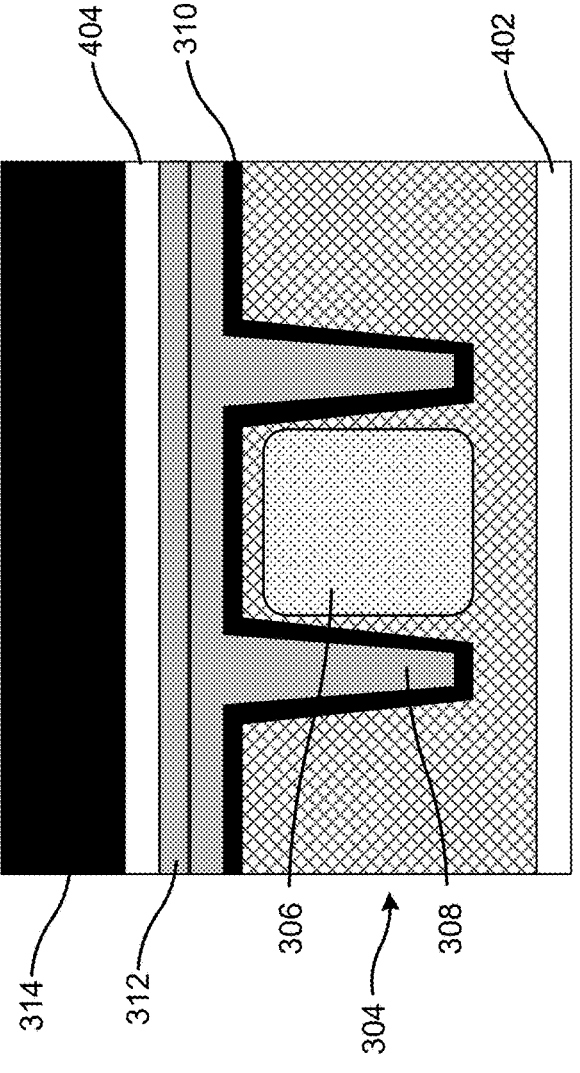

As shown in FIG. 4D, the metal layer 314 may be formed over the buffer layer 404. For example, the deposition tool 102 may form the metal layer 314 over and/or on the frontside surface of the substrate 304 (e.g., over the buffer layer 404). In some implementations, the deposition tool 102 may form the metal layer 314 using a spin-coating technique, a CVD technique, a PVD technique, an ALD technique, and/or another deposition technique.

Figure 4E:
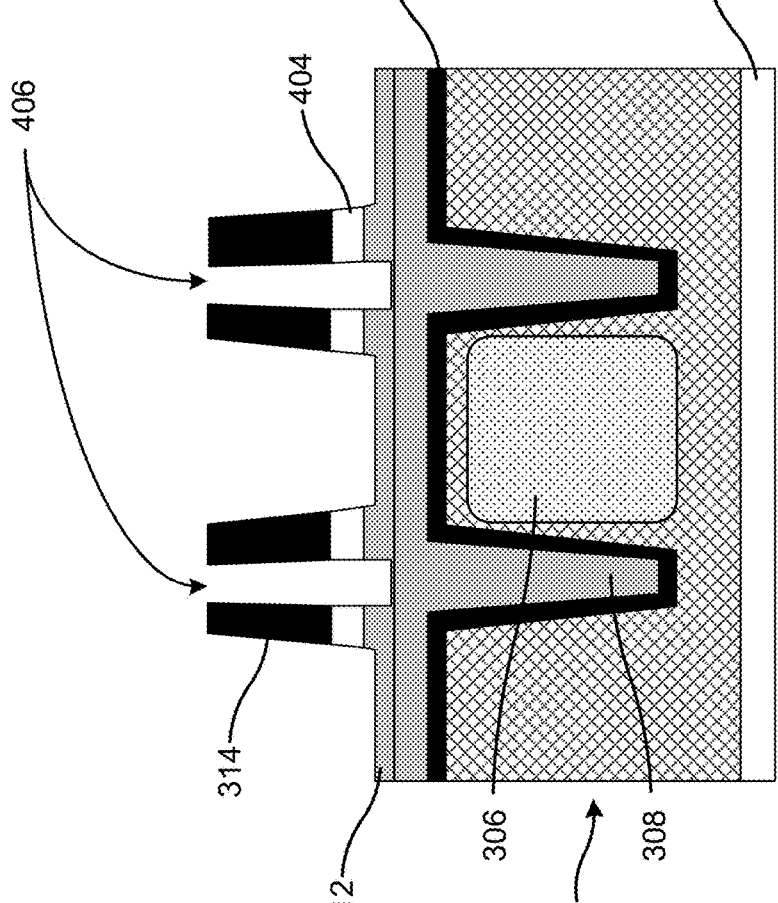

In some implementations, the metal layer 314 may be formed over the entire dielectric layer 312. As shown in FIG. 4E, a portion of the metal layer 314 may be removed. For example, the deposition tool 102 may form a photoresist layer over and/or on the frontside surface of the metal layer 314, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the metal layer 314 formed over the photodiode 306 rather than over the isolation structure 308. For example, the etch tool 108 may use a wet etch technique, a dry etch technique, a plasma-enhanced etch technique, and/or another type of etch technique to etch the portion of the metal layer 314. The photoresist removal tool 114 may remove the remaining portions of the photoresist layer (e.g., using a chemical stripper, a plasma asher, and/or another technique) after the etch tool 108 patterns the metal layer 314.

As further shown in FIG. 4E, in addition to removing a portion of the metal layer 314 formed over the photodiode 306, the etch tool 108 may form recess 406 in a portion of the metal layer 314 over the isolation structure 308. In some implementations, the pattern exposed by the developer tool 106 may also allow for the etch tool 108 to form the recess 406. Alternatively, the etch tool 108 may form the recess 406 in a separate etching process, such as a wet etch process, a dry etch process, a plasma-enhanced etch process, and/or another type of etch process. As further shown in FIG. 4E, the recess 406 may extend into the buffer layer 404 and/or the dielectric layer 312. For example, the etch tool 108 may etch a portion of the buffer layer 404 and/or the dielectric layer 312 while forming the recess 406.

Figure 4F:
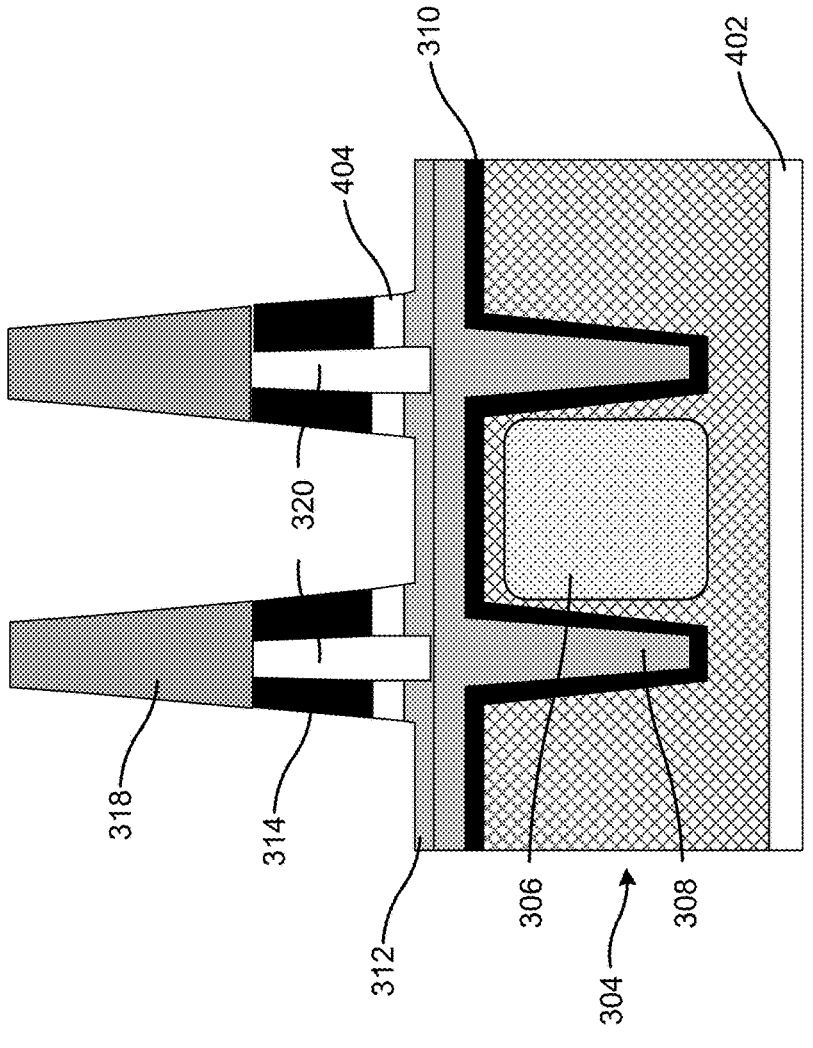

As shown in FIG. 4F, a dielectric layer 318 may be formed over the metal layer 314. For example, the deposition tool 102 may form the dielectric layer 318 over and/or on the frontside surface of the substrate 304 (e.g., over the metal layer 314). In some implementations, the deposition tool 102 may form the dielectric layer 318 using a spin-coating technique, a CVD technique, a PVD technique, an ALD technique, and/or another deposition technique.

In some implementations, the deposition tool 102 may form the dielectric layer 318 using a precursor material that selectively binds to metal. Accordingly, the precursor material may be selected for adherence to the metal layer 314 and not to the dielectric layer 312. Additionally, or alternatively, the etch tool 108 may remove portions of the dielectric layer 318 formed over the dielectric layer 312. The dielectric layer 318 is formed such that the recess 406 closes and traps air gap 320 in the metal layer 314. As a result, a carrier gas used to form the dielectric layer 318 (and any ambient gases present in the deposition tool 102) are trapped in the air gap 320.

The air gap 320 may further include the precursor material (and/or dielectric material) on a surface of the air gap 320. For example, during formation of the dielectric layer 318, some of the precursor material may deposit, and/or some of the dielectric material may form, on one or more surfaces of the air gap 320, such as an exposed surface of the metal layer 314, an exposed surface of the buffer layer 404, and/or an exposed surface of the dielectric layer 312.

Because the index of refraction of air is very low (approximately less than 1.0001, which is very close to the index of refraction of vacuum, defined as 1), incident light is very likely to experience total reflection off the air gap 320. As a result, the air gap 320 reduces photon loss and therefore increases QE and SNR of a pixel sensor including the photodiode 306.

Additionally, the deposition tool 102 may form a passivation layer (not shown) over the dielectric layer 318 and over exposed portions of the dielectric layer 312. For example, the deposition tool 102 may form the passivation layer over and/or on the frontside surface of the substrate 304. In some implementations, the deposition tool 102 may form the passivation layer using a spin-coating technique, a CVD technique, a PVD technique, an ALD technique, and/or another deposition technique.

As indicated above, FIGS. 4A-4F are provided as an example. Other examples may differ from what is described with regard to FIGS. 4A-4F.

Figure 5A:
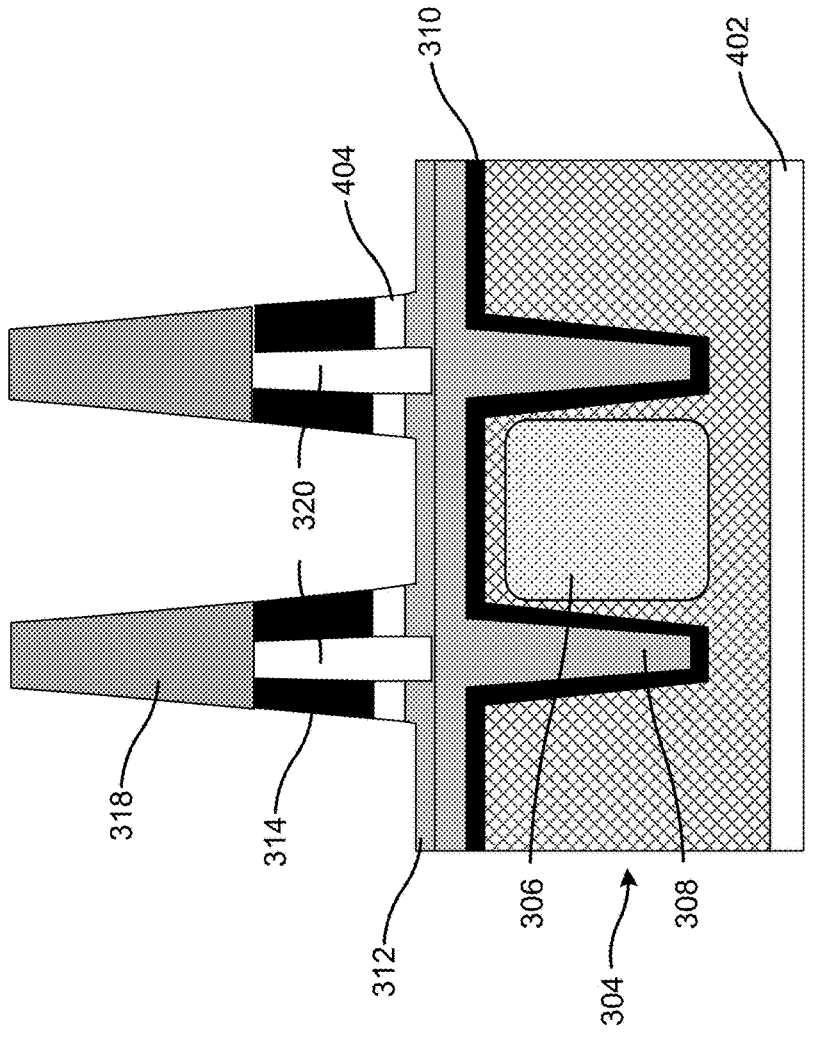
FIGS. 5A-5C are diagrams of an example implementation described herein.
Figure 5B:
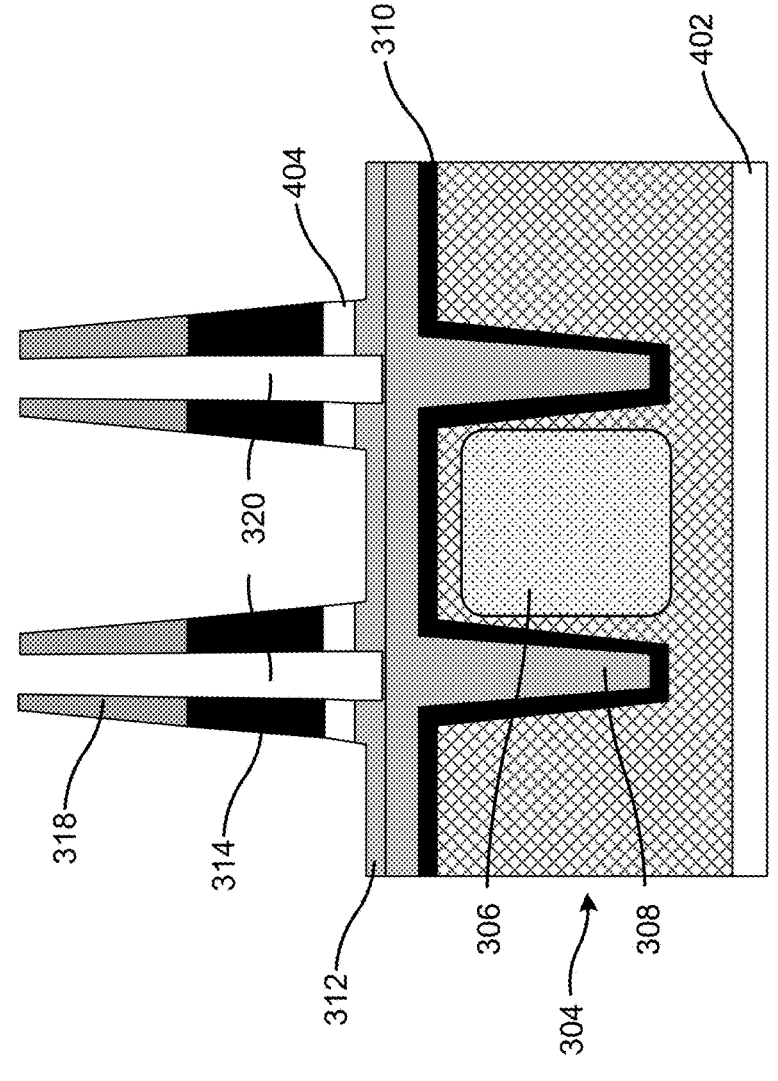
Figure 5C:
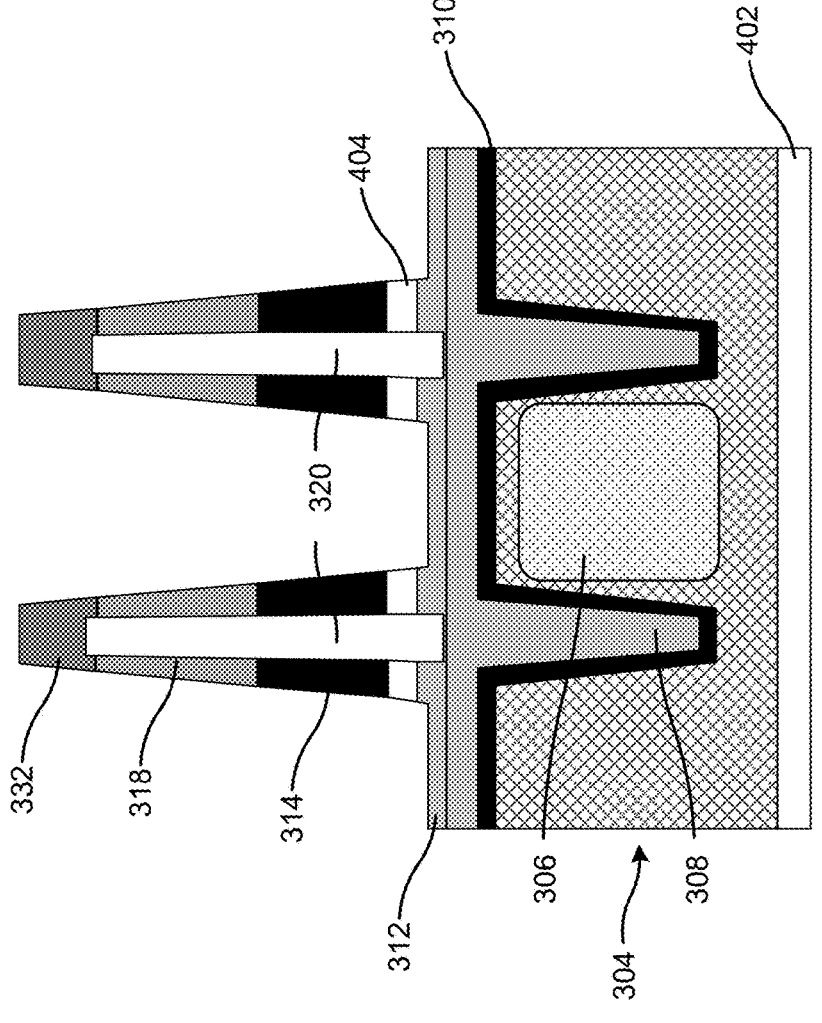

FIGS. 5A-5C are diagrams of an example implementation 500 described herein. Example implementation 500 may be an example process for forming the example pixel array 330 having air gaps in a metal layer of a hybrid shielding structure as well as a dielectric layer of the hybrid shielding structure. The example pixel array formed using example implementation 500 may be included in a CMOS image sensor, a BSI CMOS image sensor, or another type of image sensor.

As shown in FIG. 5A, example implementation 500 may include processes described in connection with FIGS. 4A-4F. As shown in FIG. 5B, a portion of the dielectric layer 318 may be removed. For example, the deposition tool 102 may form a photoresist layer over and/or on the frontside surface of the dielectric layer 318, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the dielectric layer 318 over the isolation structure 308, as shown in FIG. 5B. For example, the etch tool 108 may use a wet etch technique, a dry etch technique, a plasma-enhanced etch technique, and/or another type of etch technique to etch the portion of the dielectric layer 318. The photoresist removal tool 114 may remove the remaining portions of the photoresist layer (e.g., using a chemical stripper, a plasma asher, and/or another technique) after the etch tool 108 patterns the dielectric layer 318.

Therefore, the etch tool 108 may expose the air gap 320 again, as shown in FIG. 5B. As shown in FIG. 5C, a dielectric layer 332 may be formed over the dielectric layer 318. For example, the deposition tool 102 may form the dielectric layer 332 over and/or on the frontside surface of the substrate 304 (e.g., over the dielectric layer 318). In some implementations, the deposition tool 102 may form the dielectric layer 332 using a spin-coating technique, a CVD technique, a PVD technique, an ALD technique, and/or another deposition technique.

In some implementations, the deposition tool 102 may form the dielectric layer 332 using a precursor material that selectively binds to the material of the dielectric layer 318. Accordingly, the precursor material may be selected for adherence to the dielectric layer 318 and not to the metal layer 314. Additionally, or alternatively, the etch tool 108 may remove portions of the dielectric layer 332 formed over the metal layer 314 and/or the dielectric layer 312. The dielectric layer 332 is formed such that the air gap 320 closes again and is thus in the dielectric layer 318 as well as the metal layer 314. As a result, a carrier gas used to form the dielectric layer 332 (and any ambient gases present in the deposition tool 102) are trapped in the air gap 320.

The air gap 320 may further include the precursor material (and/or dielectric material) on a surface of the air gap 320. For example, during formation of the dielectric layer 332, some of the precursor material may deposit, and/or some of the dielectric material may form, on one or more surfaces of the air gap 320, such as an exposed surface of the dielectric layer 318, an exposed surface of the metal layer 314, an exposed surface of the buffer layer 404, and/or an exposed surface of the dielectric layer 312.

Because the air gap 320 extends into the dielectric layer 318 as well as the metal layer 314, incident light is likely to experience total reflection off the air gap 320 rather than pass through the dielectric layer 318 and into a neighboring photodiode. As a result, the air gap 320 reduces crosstalk.

Additionally, the deposition tool 102 may form a passivation layer (not shown) over the dielectric layer 332 and over exposed portions of the dielectric layer 312. For example, the deposition tool 102 may form the passivation layer over and/or on the frontside surface of the substrate 304. In some implementations, the deposition tool 102 may form the passivation layer using a spin-coating technique, a CVD technique, a PVD technique, an ALD technique, and/or another deposition technique.

As indicated above, FIGS. 5A-5C are provided as an example. Other examples may differ from what is described with regard to FIGS. 5A-5C.

FIGS. 6A-6F are diagrams of an example implementation 600 described herein. Example implementation 600 may be an example process for forming the example pixel array 350 having air gaps in both an isolation structure around a photodiode as well as a metal layer of a hybrid shielding structure. The example pixel array formed using example implementation 600 may be included in a CMOS image sensor, a BSI CMOS image sensor, or another type of image sensor.

Figure 6A:
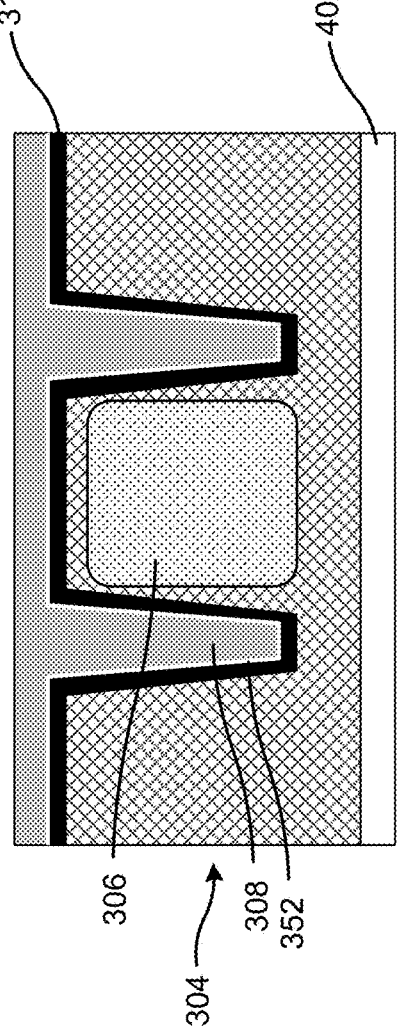
FIGS. 6A-6F are diagrams of an example implementation described herein.

As shown in FIG. 6A, the example process for forming the pixel array may be performed in connection with a substrate 304. As described above, the substrate 304 may include a semiconductor die substrate, a semiconductor wafer, a stacked semiconductor wafer, or another type of substrate in which semiconductor pixels may be formed. For example, the substrate 304 may be formed of silicon (Si) (e.g., a silicon substrate), a material including silicon, a III-V compound semiconductor material such as gallium arsenide (GaAs), an SOI, or another type of semiconductor material that is capable of generating a charge from photons of incident light. In some implementations, the substrate 304 is formed of a doped material (e.g., a p-doped material or an n-doped material) such as a doped silicon.

Additionally, the substrate 304 may have a photodiode 306 formed therein. As further shown in FIG. 6A, an isolation structure 308 (e.g., a DTI structure) may be included in the substrate 304 at least partially surrounding the photodiode 306. The isolation structure 308 may be coated or lined with an ARC 310 and filled with a dielectric layer (e.g., over the ARC 310). The isolation structure 308 may include an ESL 352 to prevent overetching of the dielectric layer filling the isolation structure 308. Similarly, the substrate 304 may be supported by an ESL 402 to prevent overetching of the substrate 304 during formation of the isolation structure 308.

Figure 6B:
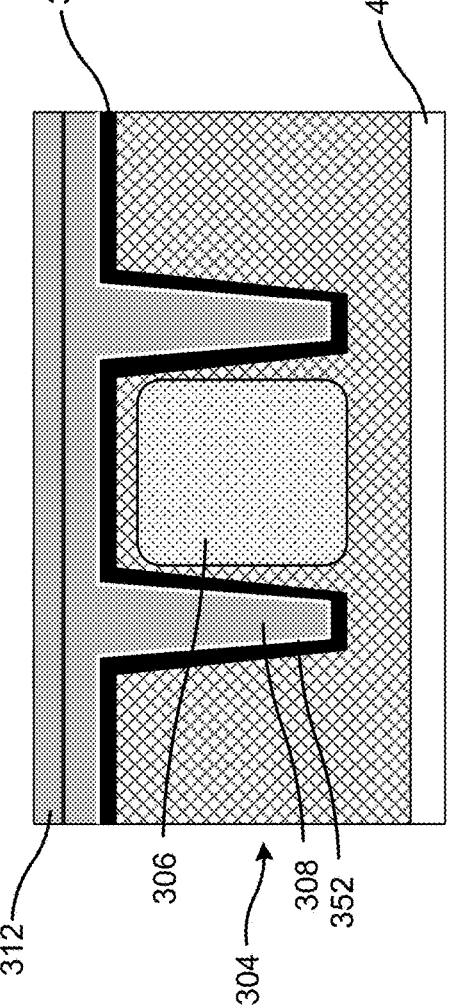

As shown in FIG. 6B, a dielectric layer 312 may be formed over the isolation structure 308. For example, the deposition tool 102 may form the dielectric layer 312 over and/or on the frontside surface of the substrate 304 (e.g., over the dielectric layer filling the isolation structure 308). In some implementations, the deposition tool 102 may form the dielectric layer 312 using a spin-coating technique, a CVD technique, a PVD technique, an ALD technique, and/or another deposition technique.

Figure 6C:
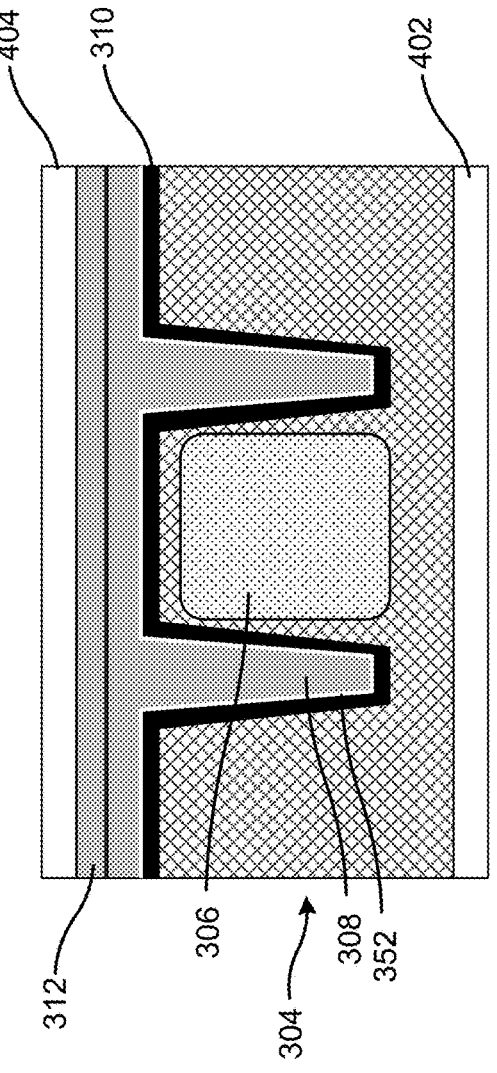

As shown in FIG. 6C, a buffer layer 404 may be formed over the dielectric layer 312. For example, the deposition tool 102 may form the buffer layer 404 over and/or on the frontside surface of the substrate 304 (e.g., over the dielectric layer 312). In some implementations, the deposition tool 102 may form the buffer layer 404 using a spin-coating technique, a CVD technique, a PVD technique, an ALD technique, and/or another deposition technique.

The buffer layer 404 may include a dielectric material to provide protection for the layers beneath the buffer layer 404 from the layers and structures that are formed above the buffer layer 404. Additionally, or alternatively, the buffer layer 404 may chemically interact with precursor materials used to deposit metal layer 314 (e.g., as described in connection with FIG. 6D). The buffer layer 404 may thus provide a surface for formation of the metal layer 314.

Figure 6D:
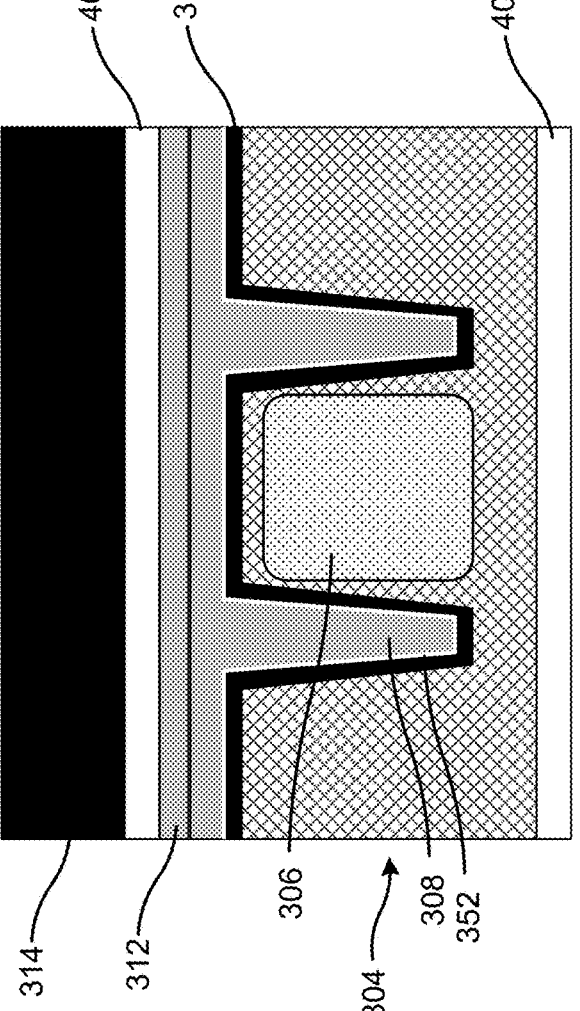

As shown in FIG. 6D, the metal layer 314 may be formed over the buffer layer 404. For example, the deposition tool 102 may form the metal layer 314 over and/or on the frontside surface of the substrate 304 (e.g., over the buffer layer 404). In some implementations, the deposition tool 102 may form the metal layer 314 using a spin-coating technique, a CVD technique, a PVD technique, an ALD technique, and/or another deposition technique.

Figure 6E:
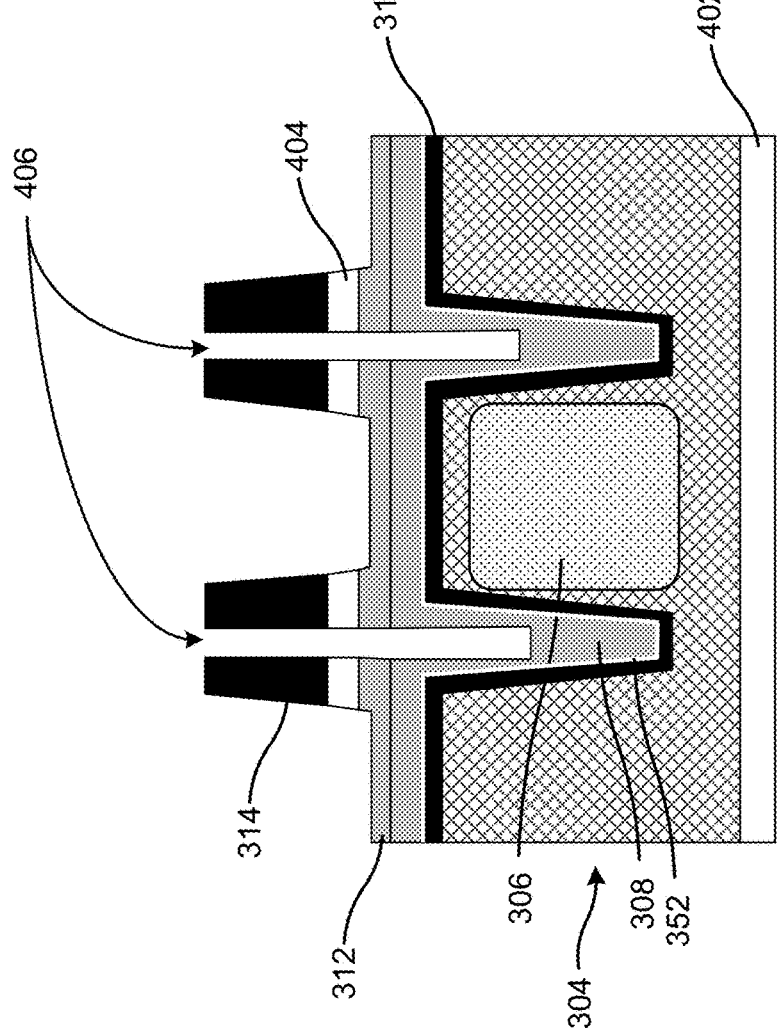

In some implementations, the metal layer 314 may be formed over the entire dielectric layer 312. As shown in FIG. 6E, a portion of the metal layer 314 may be removed. For example, the deposition tool 102 may form a photoresist layer over and/or on the frontside surface of the metal layer 314, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the metal layer 314 formed over the photodiode 306 rather than over the isolation structure 308. For example, the etch tool 108 may use a wet etch technique, a dry etch technique, a plasma-enhanced etch technique, and/or another type of etch technique to etch the portion of the metal layer 314. The photoresist removal tool 114 may remove the remaining portions of the photoresist layer (e.g., using a chemical stripper, a plasma asher, and/or another technique) after the etch tool 108 patterns the metal layer 314.

As further shown in FIG. 6E, in addition to removing a portion of the metal layer 314 formed over the photodiode 306, the etch tool 108 may form recess 406 in a portion of the metal layer 314 over the isolation structure 308. In some implementations, the pattern exposed by the developer tool 106 may also allow for the etch tool 108 to form the recess 406. Alternatively, the etch tool 108 may form the recess 406 in a separate etching process, such as a wet etch process, a dry etch process, a plasma-enhanced etch process, and/or another type of etch process. As further shown in FIG. 6E, the recess 406 may extend into the isolation structure 308. For example, the etch tool 108 may etch a portion of the isolation structure 308 while forming the recess 406. Alternatively, the etch tool 108 may expand the recess 406 into the isolation structure 308 in a separate etching process, such as a wet etch process, a dry etch process, a plasma-enhanced etch process, and/or another type of etch process.

Figure 6F:
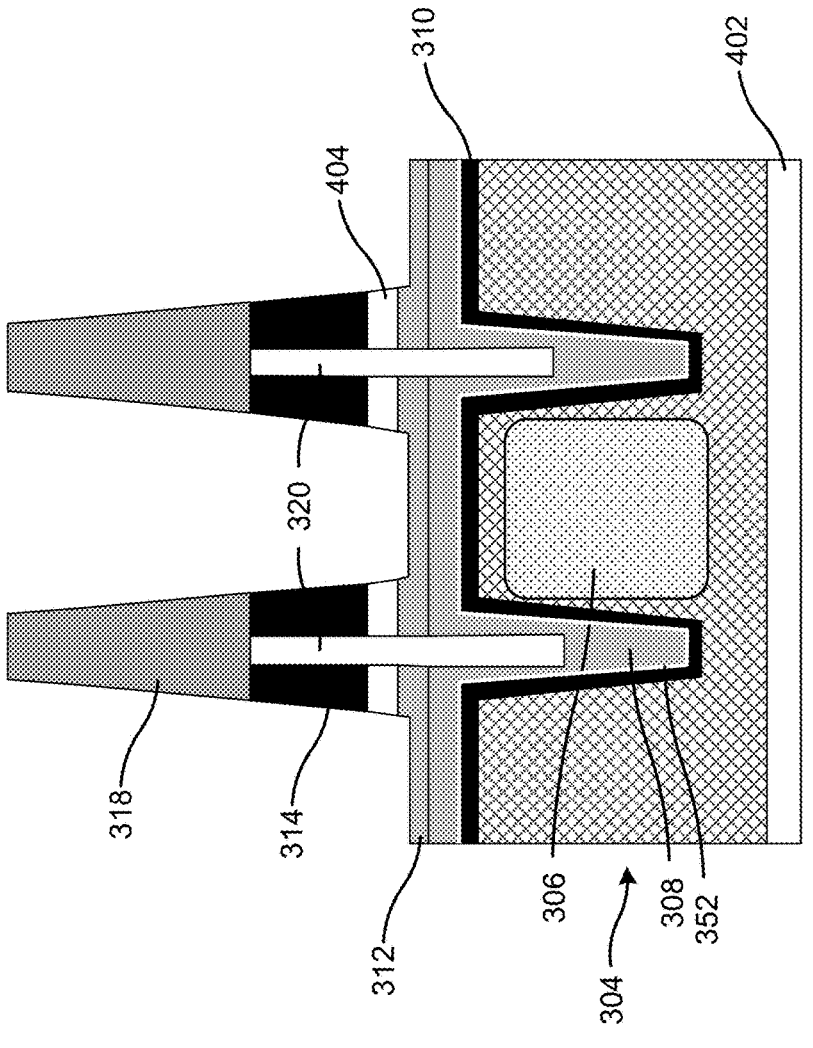

As shown in FIG. 6F, a dielectric layer 318 may be formed over the metal layer 314. For example, the deposition tool 102 may form the dielectric layer 318 over and/or on the frontside surface of the substrate 304 (e.g., over the metal layer 314). In some implementations, the deposition tool 102 may form the dielectric layer 318 using a spin-coating technique, a CVD technique, a PVD technique, an ALD technique, and/or another deposition technique.

In some implementations, the deposition tool 102 may form the dielectric layer 318 using a precursor material that selectively binds to metal. Accordingly, the precursor material may be selected for adherence to the metal layer 314 and not to the dielectric layer 312. Additionally, or alternatively, the etch tool 108 may remove portions of the dielectric layer 318 formed over the dielectric layer 312. The dielectric layer 318 is formed such that the recess 406 closes and traps air gap 320 in the metal layer 314. As a result, a carrier gas used to form the dielectric layer 318 (and any ambient gases present in the deposition tool 102) are trapped in the air gap 320.

The air gap 320 may further include the precursor material (and/or dielectric material) on a surface of the air gap 320. For example, during formation of the dielectric layer 318, some of the precursor material may deposit, and/or some of the dielectric material may form, on one or more surfaces of the air gap 320, such as an exposed surface of the metal layer 314, an exposed surface of the buffer layer 404, an exposed surface of the dielectric layer 312, and/or an exposed surface of the isolation structure 308.

Because the air gap 320 extends into the isolation structure 308 as well as the metal layer 314, incident light is likely to experience total reflection off the air gap 320 rather than pass through the isolation structure 308 and into a neighboring photodiode. As a result, the air gap 320 reduces crosstalk.

Additionally, the deposition tool 102 may form a passivation layer (not shown) over the dielectric layer 318 and over exposed portions of the dielectric layer 312. For example, the deposition tool 102 may form the passivation layer over and/or on the frontside surface of the substrate 304. In some implementations, the deposition tool 102 may form the passivation layer using a spin-coating technique, a CVD technique, a PVD technique, an ALD technique, and/or another deposition technique.

As indicated above, FIGS. 6A-6F are provided as an example. Other examples may differ from what is described with regard to FIGS. 6A-6F.

Figure 7A:
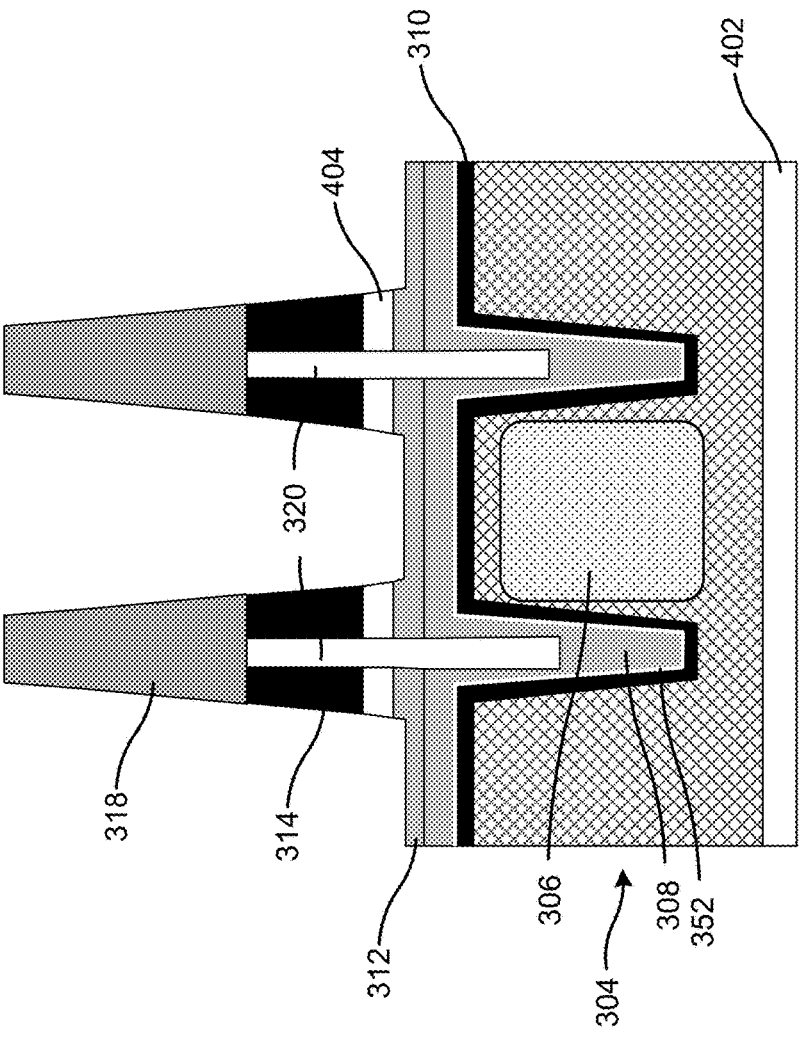
FIGS. 7A-7C are diagrams of an example implementation described herein.
Figure 7B:
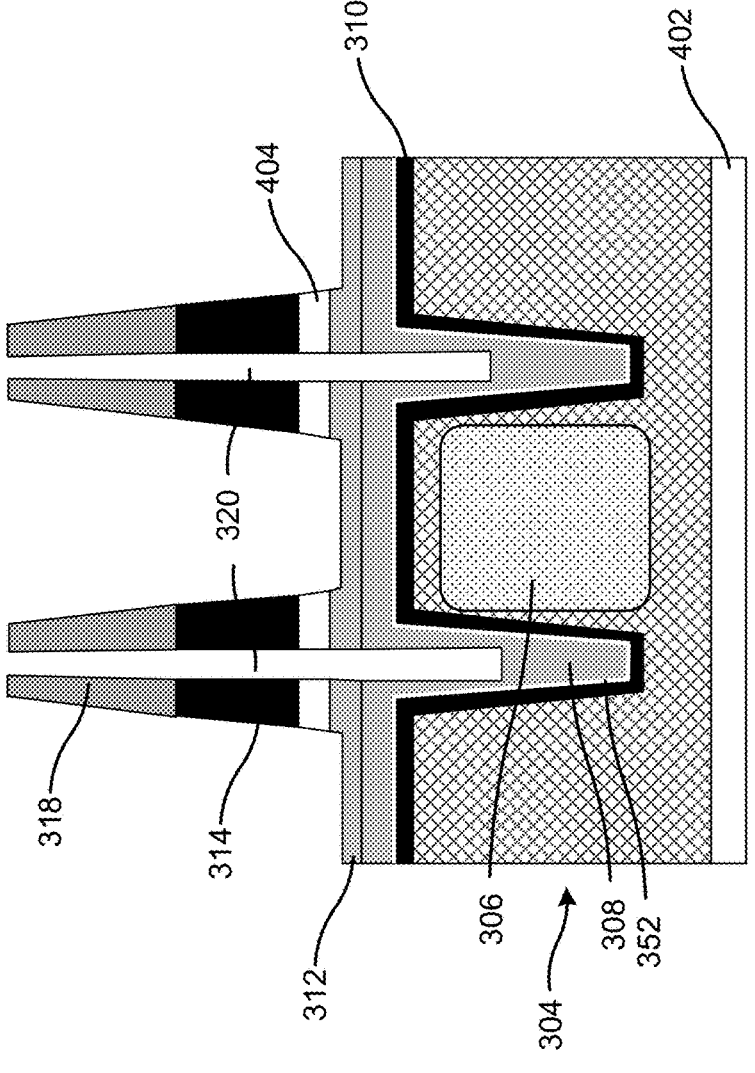
Figure 7C:
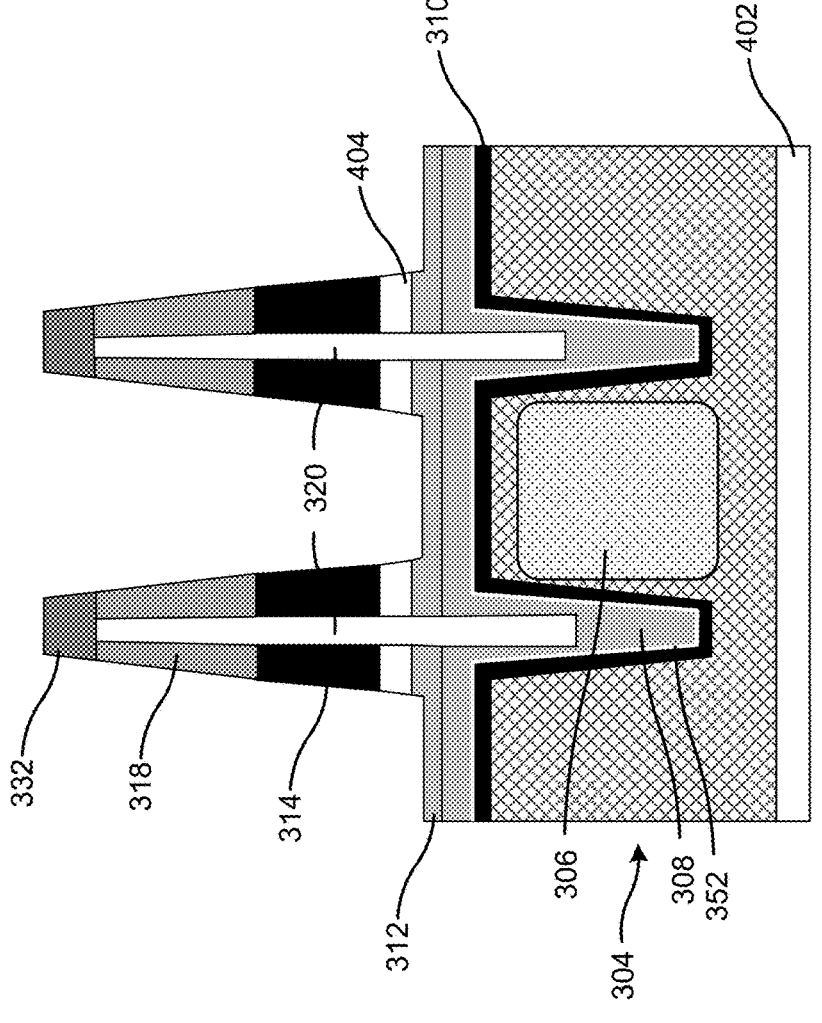

FIGS. 7A-7C are diagrams of an example implementation 700 described herein. Example implementation 700 may be an example process for forming the example pixel array 370 air gaps in an isolation structure around a photodiode, in a metal layer of a hybrid shielding structure, and in a dielectric layer of the hybrid shielding structure. The example pixel array formed using example implementation 700 may be included in a CMOS image sensor, a BSI CMOS image sensor, or another type of image sensor.

As shown in FIG. 7A, example implementation 700 may include processes described in connection with FIGS. 6A-6F. As shown in FIG. 7B, a portion of the dielectric layer 318 may be removed. For example, the deposition tool 102 may form a photoresist layer over and/or on the frontside surface of the dielectric layer 318, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the dielectric layer 318 over the isolation structure 308, as shown in FIG. 7B. For example, the etch tool 108 may use a wet etch technique, a dry etch technique, a plasma-enhanced etch technique, and/or another type of etch technique to etch the portion of the dielectric layer 318. The photoresist removal tool 114 may remove the remaining portions of the photoresist layer (e.g., using a chemical stripper, a plasma asher, and/or another technique) after the etch tool 108 patterns the dielectric layer 318.

Therefore, the etch tool 108 may expose the air gap 320 again, as shown in FIG. 7B. As shown in FIG. 7C, a dielectric layer 332 may be formed over the dielectric layer 318. For example, the deposition tool 102 may form the dielectric layer 332 over and/or on the frontside surface of the substrate 304 (e.g., over the dielectric layer 318). In some implementations, the deposition tool 102 may form the dielectric layer 332 using a spin-coating technique, a CVD technique, a PVD technique, an ALD technique, and/or another deposition technique.

In some implementations, the deposition tool 102 may form the dielectric layer 332 using a precursor material that selectively binds to the material of the dielectric layer 318. Accordingly, the precursor material may be selected for adherence to the dielectric layer 318 and not to the metal layer 314. Additionally, or alternatively, the etch tool 108 may remove portions of the dielectric layer 332 formed over the metal layer 314 and/or the dielectric layer 312. The dielectric layer 332 is formed such that the air gap 320 closes again and is thus in the dielectric layer 318 as well as the metal layer 314. As a result, a carrier gas used to form the dielectric layer 332 (and any ambient gases present in the deposition tool 102) are trapped in the air gap 320.

The air gap 320 may further include the precursor material (and/or dielectric material) on a surface of the air gap 320. For example, during formation of the dielectric layer 332, some of the precursor material may deposit, and/or some of the dielectric material may form, on one or more surfaces of the air gap 320, such as an exposed surface of the dielectric layer 318, an exposed surface of the metal layer 314, an exposed surface of the buffer layer 404, exposed surface of the dielectric layer 312, and/or an exposed surface of the isolation structure 308.

Because the air gap 320 extends into the isolation structure 308 and the dielectric layer 318 as well as the metal layer 314, incident light is likely to experience total reflection off the air gap 320 rather than pass through the isolation structure 308 or through the dielectric layer 318 and into a neighboring photodiode. As a result, the air gap 320 reduces crosstalk.

Additionally, the deposition tool 102 may form a passivation layer (not shown) over the dielectric layer 332 and over exposed portions of the dielectric layer 312. For example, the deposition tool 102 may form the passivation layer over and/or on the frontside surface of the substrate 304. In some implementations, the deposition tool 102 may form the passivation layer using a spin-coating technique, a CVD technique, a PVD technique, an ALD technique, and/or another deposition technique.

As indicated above, FIGS. 7A-7C are provided as an example. Other examples may differ from what is described with regard to FIGS. 7A-7C.

Figure 8:
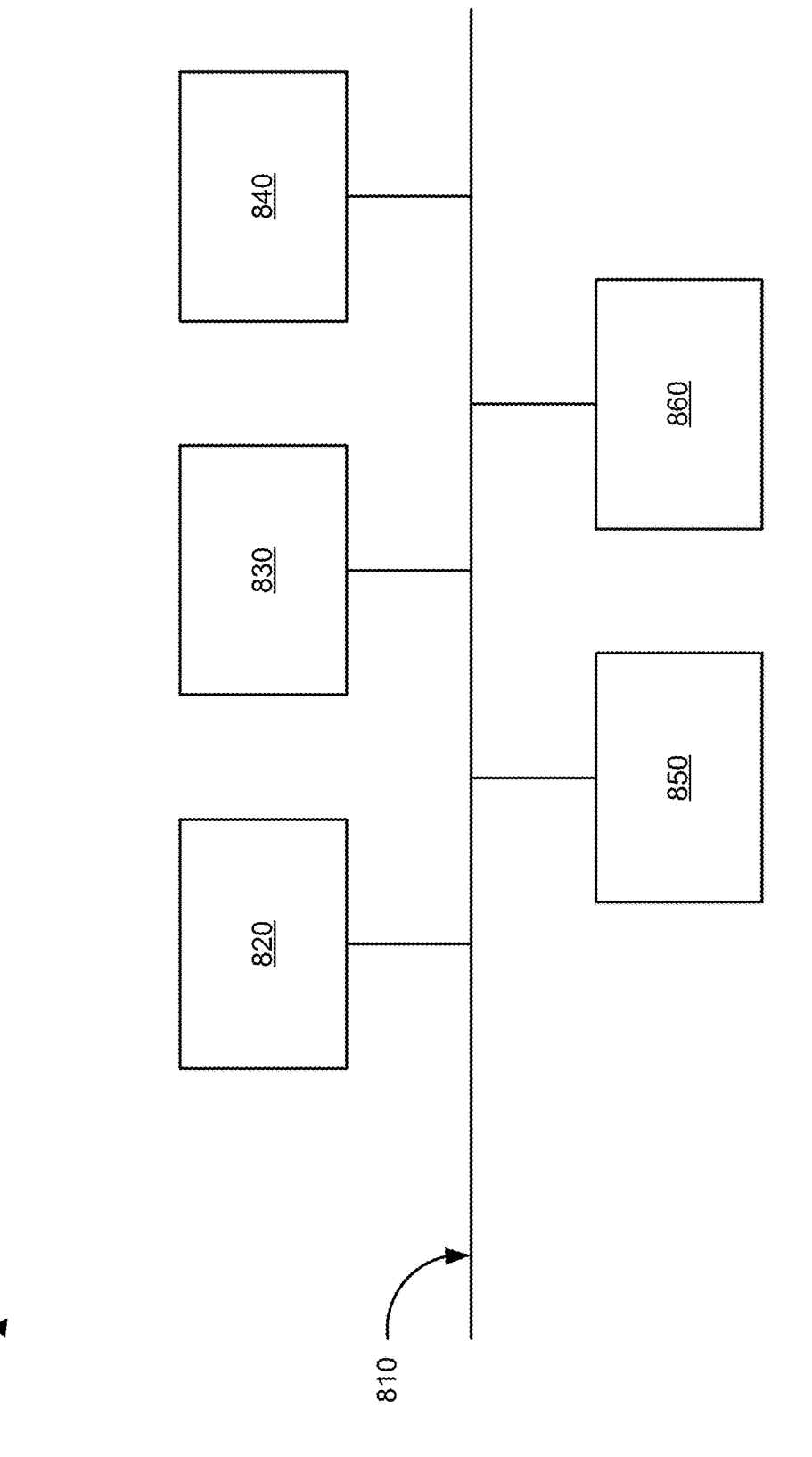
FIG. 8 is a diagram of example components of one or more devices of FIG. 1 described herein.

FIG. 8 is a diagram of example components of a device 800 described herein. In some implementations, one or more of the semiconductor processing tools 102-116 and/or the wafer/die transport tool 118 may include one or more devices 800 and/or one or more components of device 800. As shown in FIG. 8, device 800 may include a bus 810, a processor 820, a memory 830, an input component 840, an output component 850, and a communication component 860.

Bus 810 may include one or more components that enable wired and/or wireless communication among the components of device 800. Bus 810 may couple together two or more components of FIG. 8, such as via operative coupling, communicative coupling, electronic coupling, and/or electric coupling. Processor 820 may include a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 may include one or more processors capable of being programmed to perform one or more operations or processes described elsewhere herein.

Memory 830 may include volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 may include one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry is used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
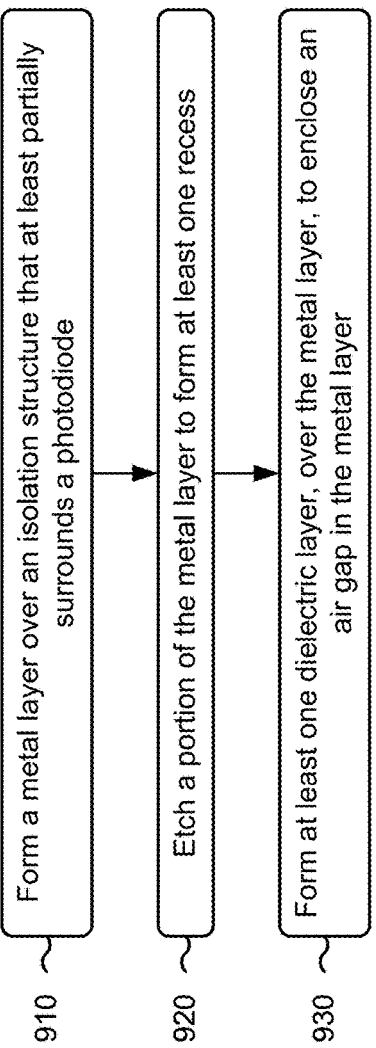
FIG. 9 is a flowchart of an example process associated with forming a semiconductor structure described herein.

FIG. 9 is a flowchart of an example process 900 associated with forming pixel sensors. In some implementations, one or more process blocks of FIG. 9 are performed by one or more semiconductor processing tools (e.g., one or more of the semiconductor processing tools 102-116). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include forming a metal layer over an isolation structure that at least partially surrounds a photodiode (block 910). For example, one or more of the semiconductor processing tools 102-116 may form a metal layer 314 over an isolation structure 308 that at least partially surrounds a photodiode 306, as described herein.

As further shown in FIG. 9, process 900 may include etching a portion of the metal layer to form at least one recess (block 920). For example, one or more of the semiconductor processing tools 102-116 may etch a portion of the metal layer 314 to form at least one recess 406, as described herein.

As further shown in FIG. 9, process 900 may include forming at least one dielectric layer over the metal layer, to enclose an air gap in the metal layer (block 930). For example, one or more of the semiconductor processing tools 102-116 may form at least one dielectric layer 318 over the metal layer 314, such that the at least one dielectric layer 318 encloses an air gap 320 in the metal layer 314, as described herein.

Process 900 may include additional implementations, such as any single implementation or any combination of implementations described below and/or in connection with one or more other processes described elsewhere herein.

In a first implementation, process 900 includes etching a portion of the isolation structure 308 to expand the at least one recess 406, such that the air gap 320 further extends into the isolation structure 308.

In a second implementation, alone or in combination with the first implementation, etching the portion of the isolation structure 308 includes etching the isolation structure 308 until exposing at least one ESL 352 between the isolation structure 308 and a surrounding substrate 304.

In a third implementation, alone or in combination with one or more of the first and second implementations, forming the at least one dielectric layer includes forming a first dielectric layer 318 over the metal layer 314 and forming a second dielectric layer 332 over the first dielectric layer 318.

In a fourth implementation, alone or in combination with one or more of the first through third implementations, process 900 includes etching a portion of the first dielectric layer 318 to expose the at least one recess 406, such that the air gap 320 further extends into the first dielectric layer 318.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

In this way, a shielding structure of air gaps, on a grid structure between pixel sensors in a pixel array, reduces crosstalk. Efficiency and SNR of the pixel sensors is increased because crosstalk is reduced. The shielding structure also increases QE of the pixel array because the air gaps do not adsorb photons.

As described in greater detail above, some implementations described herein provide a semiconductor device. The semiconductor device includes a photodiode and an isolation structure at least partially surrounding the photodiode. The semiconductor device includes a grid structure, over the isolation structure, including a metal layer with at least one air gap and at least one dielectric layer.

As described in greater detail above, some implementations described herein provide a method. The method includes forming a metal layer over an isolation structure that at least partially surrounds a photodiode. The method includes etching a portion of the metal layer to form at least one recess. The method includes forming at least one dielectric layer over the metal layer, wherein the at least one dielectric layer encloses an air gap in the metal layer.

As described in greater detail above, some implementations described herein provide a semiconductor device. The semiconductor device includes a photodiode and an isolation structure at least partially surrounding the photodiode and including at least one air gap. The semiconductor device includes a grid structure, over the isolation structure, including a metal layer and at least one dielectric layer, where the at least one air gap further extends into the metal layer.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a photodiode;
   an isolation structure at least partially surrounding the photodiode; and
   a grid structure, over the isolation structure, including a metal layer with at least one air gap, a first dielectric layer, and a second dielectric layer,
      wherein the at least one air gap further extends into the first dielectric layer.

2. The semiconductor device of claim 1, further comprising:
   oxide material on a surface of the at least one air gap.

3. The semiconductor device of claim 1, further comprising:
   a buffer layer between the isolation structure and the metal layer.

4. The semiconductor device of claim 3,
wherein the at least one air gap further extends into the
buffer layer.

5. The semiconductor device of claim 1, wherein the
second dielectric layer at least partially encloses a portion of
the at least one air gap.

6. The semiconductor device of claim 1, wherein the grid
structure further comprises a conductive via extending
through the first dielectric layer and coupled to the metal
layer.

7. A method, comprising:
forming a metal layer over an isolation structure that at
least partially surrounds a photodiode;
etching a portion of the metal layer to form at least one
recess;
etching a portion of the isolation structure to expand the
at least one recess; and
forming at least one dielectric layer over the metal layer,
wherein the at least one dielectric layer encloses an air
gap in the metal layer, wherein the air gap further
extends into the isolation structure.

8. The method of claim 7,
wherein etching the portion of the isolation structure
comprises:
etching the isolation structure until exposing at least
one etch stop layer (ESL) between the isolation
structure and a surrounding substrate.

9. The method of claim 7,
wherein forming the at least one dielectric layer com-
prises:
forming a first dielectric layer over the metal layer; and
forming a second dielectric layer over the first dielec-
tric layer.

10. The method of claim 9, further comprising:
etching a portion of the first dielectric layer to expose the
at least one recess,
wherein the air gap further extends into the first dielec-
tric layer.

22

11. The method of claim 7, further comprising:
etching a portion of the at least one dielectric layer to
expose the at least one recess, wherein the air gap
further extends into the at least one dielectric layer.

12. A semiconductor device, comprising:
a photodiode;
an isolation structure at least partially surrounding the
photodiode and including at least one air gap; and
a grid structure, over the isolation structure, including a
metal layer and at least one dielectric layer, wherein the
at least one air gap further extends into the metal layer.

13. The semiconductor device of claim 12, further com-
prising:
oxide material on a surface of the at least one air gap.

14. The semiconductor device of claim 12, further com-
prising:
at least one etch stop layer (ESL) between the isolation
structure and a surrounding substrate.

15. The semiconductor device of claim 14, further com-
prising:
a high-κ layer between the isolation structure and the
surrounding substrate.

16. The semiconductor device of claim 15,
wherein the at least one ESL is between an oxide filling
of the isolation structure and the high-κ layer.

17. The semiconductor device of claim 12,
wherein the at least one dielectric layer includes a first
dielectric layer and a second dielectric layer.

18. The semiconductor device of claim 17,
wherein the at least one air gap further extends into the
first dielectric layer.

19. The semiconductor device of claim 12, further com-
prising:
a buffer layer between the isolation structure and the metal
layer.

20. The semiconductor device of claim 19,
wherein the at least one air gap further extends into the
buffer layer.

* * * * *